United States Patent
He et al.

(10) Patent No.: US 11,031,066 B2
(45) Date of Patent: Jun. 8, 2021

(54) METHODS FOR ADJUSTING MEMORY DEVICE REFRESH OPERATIONS BASED ON MEMORY DEVICE TEMPERATURE, AND RELATED MEMORY DEVICES AND SYSTEMS

(71) Applicant: Micron Technology, Inc., Boise, ID (US)

(72) Inventors: Yuan He, Boise, ID (US); Yutaka Ito, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/567,155

(22) Filed: Sep. 11, 2019

(65) Prior Publication Data

US 2020/0402569 A1 Dec. 24, 2020

Related U.S. Application Data

(63) Continuation-in-part of application No. 16/450,198, filed on Jun. 24, 2019, now abandoned.

(51) Int. Cl.
*G11C 11/406* (2006.01)
*G11C 11/409* (2006.01)

(52) U.S. Cl.
CPC ...... *G11C 11/40626* (2013.01); *G11C 11/409* (2013.01); *G11C 11/40615* (2013.01); *G11C 11/40622* (2013.01); *G11C 2211/4065* (2013.01)

(58) Field of Classification Search
CPC ... G11C 11/406; G11C 8/10; G11C 11/40626; G11C 11/40622; G11C 11/409; G11C 11/40615; G11C 2211/4065

USPC ............................................. 365/222, 230.06
See application file for complete search history.

(56) References Cited

U.S. PATENT DOCUMENTS

| | | | |
|---|---|---|---|
| 7,233,538 B1* | 6/2007 | Wu | ........................ G11C 11/406 365/222 |
| 9,032,141 B2 | 5/2015 | Bains et al. | |
| 9,183,917 B1 | 11/2015 | Cho | |
| 9,640,242 B1* | 5/2017 | Lo | ...................... G11C 11/40618 |
| 9,653,142 B1* | 5/2017 | Kihara | .............. G11C 11/40615 |
| 9,741,421 B1 | 8/2017 | Hedden | |

(Continued)

FOREIGN PATENT DOCUMENTS

WO 2018/217582 A3 1/2019

OTHER PUBLICATIONS

Zhang et al., U.S. Appl. No. 16/135,877, titled Row Hammer Refresh for Memory Devices, filed Sep. 19, 2018.

(Continued)

*Primary Examiner* — Michael T Tran
(74) *Attorney, Agent, or Firm* — TraskBritt

(57) ABSTRACT

Methods of operating a memory device are disclosed. A method may include determining an operating temperature of a memory bank of a memory device. The method may also include adjusting at least one refresh interval for the memory bank based on the operating temperature of the memory bank. Further, the method may include skipping at least one refresh of the memory bank based on at least one of the operation temperature of the memory bank and a number of active signals received at the memory bank. A memory device and an electronic system are also described.

18 Claims, 25 Drawing Sheets

(56) References Cited

U.S. PATENT DOCUMENTS

| | | | |
|---|---|---|---|
| 9,747,971 B2 | 8/2017 | Bains et al. | |
| 9,805,783 B2 | 10/2017 | Ito et al. | |
| 10,061,541 B1* | 8/2018 | Lee | G11C 8/12 |
| 10,067,672 B2 | 9/2018 | Chinnakkonda Vidyapoornachary et al. | |
| 10,410,730 B1* | 9/2019 | Boenapalli | G06F 12/0246 |
| 10,599,504 B1 | 3/2020 | Beserra et al. | |
| 2005/0152199 A1 | 7/2005 | Park et al. | |
| 2006/0195289 A1 | 8/2006 | Choi et al. | |
| 2007/0030019 A1 | 2/2007 | Kinsley | |
| 2007/0106838 A1 | 5/2007 | Choi | |
| 2007/0121408 A1* | 5/2007 | Yang | G11C 11/40615 365/222 |
| 2007/0140315 A1 | 6/2007 | Janzen et al. | |
| 2009/0058539 A1 | 3/2009 | Hong | |
| 2009/0147607 A1 | 6/2009 | Nin | |
| 2009/0238020 A1 | 9/2009 | Mayer et al. | |
| 2009/0316501 A1 | 12/2009 | Bunker et al. | |
| 2010/0142291 A1 | 6/2010 | Joo et al. | |
| 2010/0182851 A1* | 7/2010 | Lee | G11C 5/00 365/189.09 |
| 2010/0182862 A1 | 7/2010 | Teramoto | |
| 2011/0055671 A1* | 3/2011 | Kim | G11C 7/222 714/800 |
| 2011/0299352 A1 | 12/2011 | Fujishiro et al. | |
| 2012/0099389 A1* | 4/2012 | Park | G11C 11/40622 365/200 |
| 2012/0170396 A1 | 7/2012 | Kim | |
| 2012/0249219 A1* | 10/2012 | Shoemaker | G01K 3/08 327/512 |
| 2012/0250680 A1 | 10/2012 | Tsuchiya et al. | |
| 2012/0327734 A1 | 12/2012 | Sato | |
| 2013/0279284 A1* | 10/2013 | Jeong | G11C 11/40611 365/222 |
| 2015/0003164 A1 | 1/2015 | Roohparvar | |
| 2015/0036445 A1 | 2/2015 | Yoshida et al. | |
| 2015/0058549 A1 | 2/2015 | Jeffrey et al. | |
| 2015/0235694 A1* | 8/2015 | Kim | G11C 7/02 365/222 |
| 2015/0301932 A1* | 10/2015 | Oh | G06F 11/30 711/102 |
| 2015/0373876 A1* | 12/2015 | Berke | G05B 15/02 700/282 |
| 2015/0380073 A1 | 12/2015 | Joo et al. | |
| 2016/0125921 A1 | 5/2016 | Kambegawa | |
| 2016/0125931 A1 | 5/2016 | Doo et al. | |
| 2016/0155490 A1 | 6/2016 | Shin et al. | |
| 2016/0203854 A1 | 7/2016 | Kim | |
| 2016/0300816 A1* | 10/2016 | Park | H01L 23/34 |
| 2016/0307620 A1* | 10/2016 | Chun | G11C 11/4096 |
| 2017/0047110 A1* | 2/2017 | Kang | G11C 11/4087 |
| 2017/0068466 A1* | 3/2017 | Kiyooka | G11C 16/10 |
| 2017/0083259 A1* | 3/2017 | Lee | G11C 11/40626 |
| 2017/0117033 A1* | 4/2017 | Doo | G11C 11/40626 |
| 2017/0148504 A1 | 5/2017 | Saifuddin et al. | |
| 2017/0186481 A1* | 6/2017 | Oh | G11C 11/40615 |
| 2017/0345483 A1* | 11/2017 | Wang | G11C 29/50008 |
| 2018/0005690 A1 | 1/2018 | Morgan et al. | |
| 2018/0114737 A1* | 4/2018 | Choi | H01L 23/4012 |
| 2018/0166124 A1* | 6/2018 | Suwada | G11C 5/04 |
| 2018/0197599 A1* | 7/2018 | Choi | G11C 11/40615 |
| 2018/0218767 A1 | 8/2018 | Wolff | |
| 2019/0196740 A1* | 6/2019 | Notani | G06F 1/32 |
| 2019/0198090 A1* | 6/2019 | Lee | G11C 11/403 |
| 2020/0019458 A1* | 1/2020 | Cadloni | G11C 29/44 |
| 2020/0098421 A1* | 3/2020 | Alsasua | G11C 11/40615 |
| 2020/0402569 A1* | 12/2020 | He | G11C 11/40622 |
| 2021/0020231 A1* | 1/2021 | Deng | G11C 11/4091 |
| 2021/0020232 A1* | 1/2021 | Bayat | G11C 11/4093 |

OTHER PUBLICATIONS

Meier et al., U.S. Appl. No. 16/396,363 titled Methods for Controlling Row Hammer Refresh Operations of a Memory Device, and Related Memory Devices and Systems, filed Apr. 26, 2019.

Lee, Joo-Sang, U.S. Appl. No. 16/391,560 titled Methods for Adjusting Row Hammer Refresh Rates and Related Memory Devices and Systems, filed Apr. 23, 2019.

Ito et al., Apparatus and Methods for Refreshing Memory, U.S. Appl. No. 15/789,897, filed Oct. 27, 2017.

\* cited by examiner

400

| tmfzRefCyc | Refresh Period | Pumps/AREF |
|---|---|---|
| 0 (default) | 32ms | 8 rows |
| 1 | 64ms | 4 rows |

| tmfzRefSkip | tmfzRefCyc = 0 (default) | | tmfzRefCyc = 1 | | AREF-Command Skip-Rate |
|---|---|---|---|---|---|
| | Refresh Period | Pumps Sequence On 8 AREFs | Refresh Period | Pumps Sequence On 8 AREFs | |
| 0 (default) | 32ms | 8-8-8-8-8-8-8-8 | 64ms | 4-4-4-4-4-4-4-4 | 0 of 2 |
| 1 | 64ms | 8-x-8-x-8-x-8-x | 128ms | 4-x-4-x-4-x-4-x | 1 of 2 |

FIG. 5

FIG. 6 tmfzRefCyc = 0

| tmfzRefSkip | First Temp Range | Second Temp Range | Third Temp Range |
|---|---|---|---|
| 0 (default) | 32ms<br>8-8-8-8-8-8-8-8 | 48ms<br>8-8-x-8-8-x-8-8 | 64ms<br>8-x-8-x-8-x-8-x |
| 1 | 64ms<br>8-x-8-x-8-x-8-x | 96ms<br>8-x-x-8-x-x-8-x | 128<br>8-x-x-x-8-x-x-x | tmfzRefCyc = 1

| tmfzRefSkip | First Temp Range | Second Temp Range | Third Temp Range |
|---|---|---|---|
| 0 (default) | 64ms<br>4-4-4-4-4-4-4-4 | 96ms<br>4-4-x-4-4-x-4-4 | 128ms<br>4-x-4-x-4-x-4-x |
| 1 | 128ms<br>4-x-4-x-4-x-4-x | 192ms<br>4-x-x-4-x-x-4-x | 256ms<br>4-x-x-x-4-x-x-x |

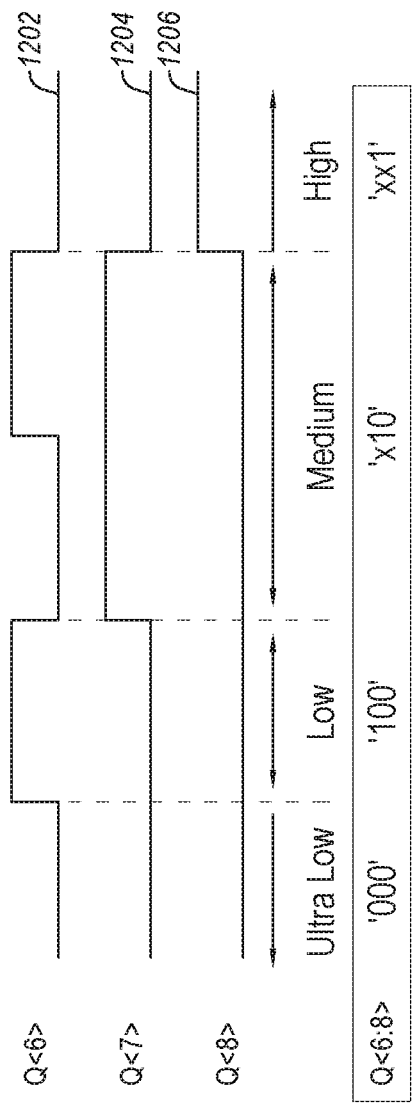

| TS<2:0> Or MR4<2:0> 1452 | Temperature Range 1454 | Refresh Interval Multiplier W/ tmfzRefSkip<1:0> 1456 | | | |
|---|---|---|---|---|---|
| | | 00 | 01 | 10 | 11 |
| 000 | RFU (Low Temp) | | | | |
| 001 | ...35°C | 4x | 8x | 2x | 4x |
| 010 | 35...60°C | 2x | 4x | 1.5x | 3x |
| 011 | 60...85°C | 1x | 2x | 1x | 2x |
| 100 | 85...110°C | 0.5x | 1x | 0.5x | 1x |
| 101 | 110°C... | | 0.5x | 0.25x | |
| 110 | RFU (High Temp) | 0.25x | | | 0.5x |
| 111 | | | | | |

| AREF Command 1458 | | | | | RHR (Steal Refresh) 1460 | | | | | | |
|---|---|---|---|---|---|---|---|---|---|---|---|
| tREFI Multiplier | Skip-Rate W/ tmfzRefSkip<1:0> | | | | Steal-Rate W/ Act's Count Grade | | | | Skip-Rate W/ Act's Count Grade | | |
| | 00 | 01 | 10 | 11 | UL | L | M | H | UL | L | M | H |
| 1x | 3/4 | 7/8 | 1/2 | 3/4 | 0% | 1/(64+1) | 1/(32+1) | 1/(16+1) | 100% | 3/4 (75%) | 1/2 (50%) | 0% |
| 0.5x | 1/2 | 3/4 | 1/3 | 2/3 | | 1/(128+1) | 1/(64+1) | 1/(32+1) | | | | |
| 0.25x | 0% | 1/2 | 0% | 1/2 | | | | | | | | |

*FIG. 14B*

METHODS FOR ADJUSTING MEMORY DEVICE REFRESH OPERATIONS BASED ON MEMORY DEVICE TEMPERATURE, AND RELATED MEMORY DEVICES AND SYSTEMS

CROSS-REFERENCE TO RELATED APPLICATION

This application is a continuation-in-part of U.S. patent application Ser. No. 16/450,198, filed Jun. 24, 2019, pending, the disclosure of which is hereby incorporated herein in its entirety by this reference.

TECHNICAL FIELD

Embodiments of the disclosure relate to adjusting one or more operational rates of a memory device based on memory device temperature and, more specifically, to adjusting a refresh interval, an auto refresh rate, and/or a row hammer refresh steal rate of a memory device based on an operating temperature of the memory device and/or an number of activations ("an activation number") associated with the memory device. Yet more specifically, some embodiments relate to methods for such adjusting, and related memory devices and systems.

BACKGROUND

Memory devices are typically provided as internal, semiconductor, integrated circuits in computers or other electronic systems. There are many different types of memory including volatile and non-volatile memory. Volatile memory may require power to maintain its data (e.g., host data, error data, etc.) and includes random access memory (RAM), Dynamic random access memory (DRAM), Static random access memory (SRAM), Synchronous dynamic random access memory (SDRAM), Content addressable memory (CAM), and Thyristor random access memory (TRAM), among others.

A variety of operations are performed in DRAM devices, each of which affects the rate at which the DRAM device consumes power. One operation that tends to consume power at a substantial rate is a refresh of memory cells in the DRAM device. As is well-known in the art, DRAM memory cells, each of which essentially consists of a capacitor, must be periodically refreshed to retain data stored in the DRAM device. A refresh (also referred to herein as an "auto refresh" or a "normal refresh") is typically performed by essentially reading data bits from the memory cells in each row of a memory cell array and then writing those same data bits back to the same cells in the row. This refresh is generally performed on a row-by-row basis at a rate needed to keep charge stored in the memory cells from leaking excessively between refreshes. The current standard requires that memory cells be refreshed within a 64 millisecond interval, and, at higher temperatures, memory cells may need to be refreshed within a 32 millisecond interval (e.g., to account for a higher charge leakage rate). Since a refresh operation essentially involves reading data bits from and writing data bits to a large number of memory cells, a refresh operation tends to be a particularly power-hungry operation.

Further, as memory density has increased, intermittent failure has appeared in some memory devices, which devices may experience failures due to repeated access to a particular row of memory cells (e.g., cells coupled to an access line). For example, rows physically adjacent a row being frequently accessed have an increased probability of experiencing data corruption. The repeated access of a particular row can be referred to as a "hammering" event, and the hammering of a row may cause issues such as migration across a pass gate, for example. Leakage and parasitic currents caused by the hammering of a row may cause data corruption in a non-accessed physically adjacent row, which may be referred to as a neighbor row or victim row. The resulting corruption issue may be referred to as hammer disturb and/or row hammer disturb, for instance.

The row hammer effect is due to the nature of a memory cell, which may include one transistor and one capacitor. The charge state of a capacitor may determine whether a memory cell stores a "1" or "0" as a binary value. In addition, a large number of memory cells are packed tightly together. The closely packed cells may cause an activated capacitor to have an effect on a charge of an adjacent capacitor, especially when one of the cells is rapidly activated (e.g., a row hammer effect). In addition, the capacitors may have a natural discharge rate and may be rewritten (refreshed) in order to compensate for this discharge.

Some approaches to reduce the adverse effects of row hammering on adjacent rows include refreshing adjacent rows responsive to a determination that a hammering event has occurred. For example, responsive to determining that a particular row has been the target of repeated accesses (e.g., the row has undergone more than a threshold number of accesses within a refresh period), its physically adjacent neighbor rows may be selected for a targeted refresh operation, which may be referred to as a row hammer refresh operation.

BRIEF DESCRIPTION OF THE DRAWINGS

FIG. 4 shows a table illustrating selectable example refresh intervals for a memory device, according to various embodiments of the present disclosure.

FIG. 5 illustrates a table showing various example refresh intervals and associated settings for a memory device, in accordance with various embodiments of the present disclosure.

FIG. 6 depicts a table including various example refresh interval and settings for a memory device operating at various temperatures, in accordance with various embodiments of the present disclosure.

FIG. 10 shows a table depicting various passing rates for a number of asserted active signals received at a memory device, in accordance with various embodiments of the present disclosure.

FIG. 11 depicts an example timing diagram illustrating possible values of multi-bit words and associated activity levels of a memory device, according to one or more embodiments of the present disclosure.

FIGS. 14A and 14B show another table depicting various example inputs, temperature ranges, refresh intervals, commands, and operating rates of a memory device, according to various embodiments of the present disclosure.

DETAILED DESCRIPTION

As memory density increases, the amount of power required to perform auto refreshers (also referred to herein as "normal refreshes") and/or row hammer refreshes (RHRs) on a memory device also increases. Various embodiments of the disclosure relate to adjusting auto refresh rates for memory devices. More specifically, in some embodiments, an auto refresh rate of one or more memory banks of a memory device may be independently adjusted based on an operating temperature of the memory device. Alternatively or additionally, according to some embodiments, an auto refresh skip rate for the one or more memory banks may be adjusted. For example, an auto refresh skip rate for a memory bank may be adjusted based an operating temperature of the memory bank and/or an auto refresh rate of the memory bank.

Further, various embodiments of the disclosure relate to adjusting row hammer refresh rates (also referred to herein as "steal rates" or "row hammer refresh steal rates") for memory devices. More specifically, according to some embodiments, row hammer refresh rates for one or more memory banks of a memory device may be independently adjusted based on temperature of the memory device and an amount of activity (e.g., a number of row accesses) associated with the one or more memory banks. Yet more specifically, according to some embodiments, a temperature of a memory bank may be determined and a number of active signals associated with a memory bank (e.g., a number of activations at the memory bank) may be counted (e.g., during a time interval). Further, a row hammer refresh rate of the memory bank (e.g., for a subsequent time interval) may be adjusted based on the temperature and the number of active signals.

Various embodiments, as disclosed more fully herein, may decrease power consumption and processing overhead of a memory device without substantially decreasing performance and/or reliability of the memory device. More specifically, at least some embodiments may eliminate unnecessary refresh operations, thus reducing power consumption while still mitigating undesirable effects (e.g., leakage and/or row hammer effects).

Figure 1A:
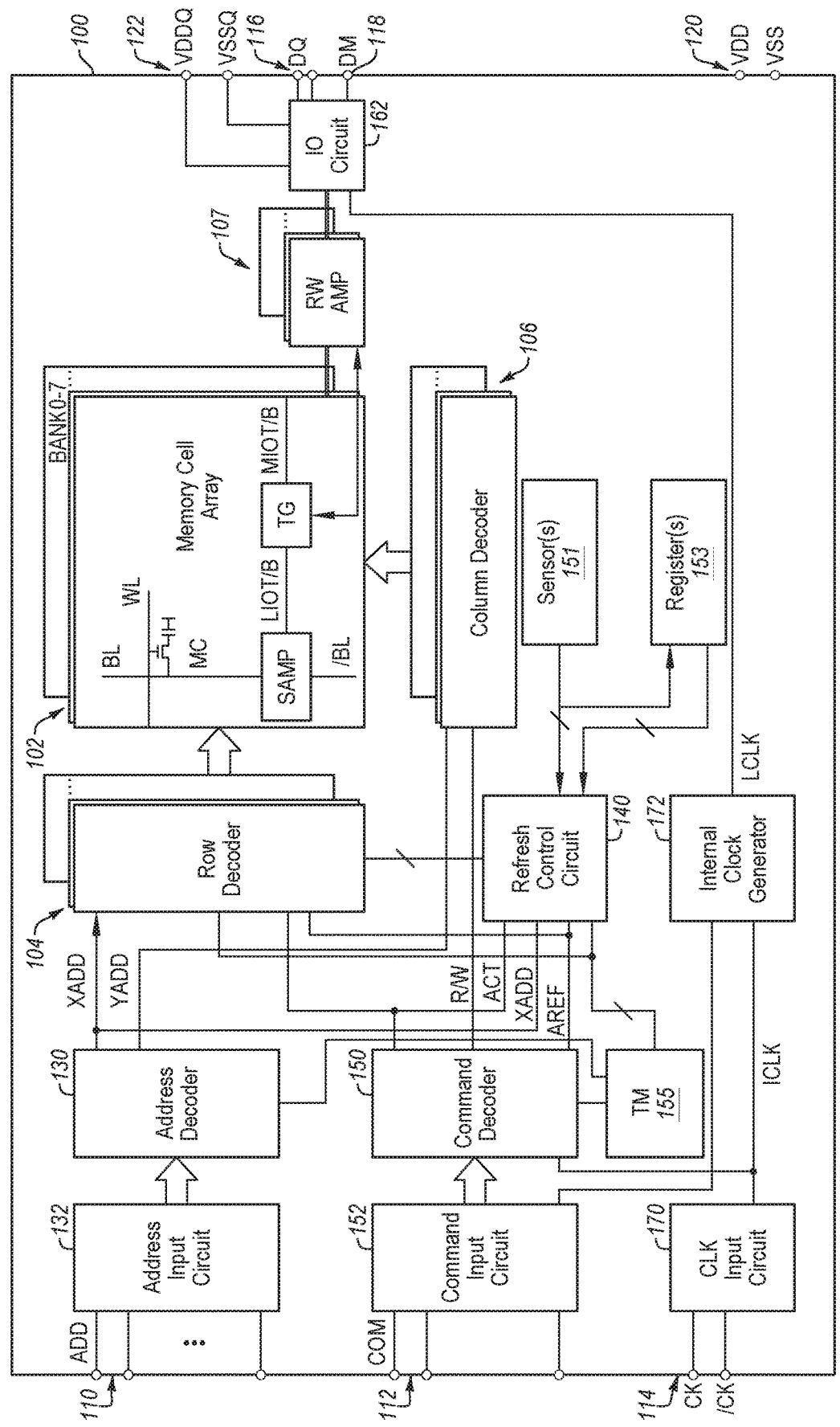
FIG. 1A is a block diagram of an example memory device, in accordance with at least one embodiment of the present disclosure.

FIG. 1A is a block diagram of a memory device 100, in accordance with one or more embodiments of the present disclosure. Memory device 100 may include, for example, a DRAM (dynamic random access memory), a SRAM (static random access memory), a SDRAM (synchronous dynamic random access memory), a DDR SDRAM (double data rate DRAM), a SGRAM (synchronous graphics random access memory), or content addressable memory (CAM). Memory device 100, which may be integrated on a semiconductor chip, may include a memory cell array 102.

In the embodiment of FIG. 1A, memory cell array 102 is shown as including eight memory banks BANK0-7. More or fewer banks may be included in memory cell array 102 of other embodiments. Each memory bank includes a number of word lines WL, a number of bit lines BL and /BL, and a number of memory cells MC arranged at intersections of the number of word lines WL and the number of bit lines BL and /BL. The selection of a word line WL may be performed by a row decoder 104 and the selection of the bit lines BL and /BL may be performed by a column decoder 106. In the embodiment of FIG. 1A, row decoder 104 may include a respective row decoder for each memory bank BANK0-7, and column decoder 106 may include a respective column decoder for each memory bank BANK0-7.

Bit lines BL and /BL are coupled to a respective sense amplifier SAMP. Read data from bit line BL or /BL may be amplified by sense amplifier SAMP, and transferred to read/write amplifiers 107 over complementary local data lines (LIOT/B), transfer gate (TG), and complementary main data lines (MIOT/B). Conversely, write data outputted from read/write amplifiers 107 may be transferred to sense amplifier SAMP over complementary main data lines MIOT/B, transfer gate TG, and complementary local data lines LIOT/B, and written in memory cell MC coupled to bit line BL or /BL.

Memory device 100 may be generally configured to be receive various inputs (e.g., from an external controller) via various terminals, such as address terminals 110, command terminals 112, clock terminals 114, data terminals 116, and data mask terminals 118. Memory device 100 may include additional terminals such as power supply terminals 120 and 122.

During a contemplated operation, one or more command signals COM, received via command terminals 112, may be conveyed to a command decoder 150 via a command input circuit 152. Command decoder 150 may include a circuit configured to generate various internal commands via decoding one or more command signals COM. Examples of the internal commands include an active signal ACT, a read/write signal R/W, and a refresh signal AREF. In some embodiments, refresh signal AREF may include and/or may be based on a refresh command (e.g., received from an external controller; not shown in FIG. 1A).

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106. Row address XADD, which may be supplied to a refresh control circuit 140, may be a signal including multiple bits (which may be transmitted in series or in parallel) and may correspond to a specific row of a memory bank (e.g., the memory bank activated by, for example, active signal ACT).

Active signal ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 106 may be activated, and the bit line BL specified by column address YADD may be selected.

In response to active signal ACT, a read signal, a row address XADD, and a column address YADD, data may be read from memory cell MC specified by row address XADD and column address YADD. The read data may be output via a sense amplifier SAMP, a transfer gate TG, read/write amplifier 107, an input/output circuit 162, and data terminal 116. Further, in response to active signal ACT, a write signal, a row address XADD, and a column address YADD, write data may be supplied to memory cell array 102 via data terminal 116, input/output circuit 162, read/write amplifier 107, transfer gate TG, and sense amplifier SAMP. The write data may be written to memory cell MC specified by row address XADD and column address YADD.

Refresh signal AREF may include a pulse signal that is activated when a command signal COM includes an auto refresh command (e.g., an external refresh command). Refresh signal AREF may be supplied to refresh control circuit 140, which is also configured to receive active signal ACT and row address XADD. In some embodiments, refresh control circuit 140 may also be configured to receive temperature data indicative of an operating temperature of memory device 100. More specifically, for example, refresh control circuit 140 may be configured to receive temperature data from one or more sensors (e.g., temperature sensors) 151 and/or one or more registers (e.g., a mode register (MR)) 153 of memory device 100.

Refresh control circuit 140 is configured to provide a row address RXADD that specifies a particular word line to be refreshed. In some examples, refresh control circuit 140 may provide row address RXADD responsive to sequential refresh commands received from an external controller (not shown in FIG. 1A). Further, refresh control circuit 140 may provide other signals to row decoder 104, such as an instruction signal StealSlot and/or an effective auto refresh AREFe, as described more fully below. In some embodiments, refresh control circuit 140 may include a controller and/or a circuit configured to skip one or more auto refreshes during a time interval. Further, refresh control circuit 140 may include a controller configured to "steal" or otherwise preempt a refresh command received from the external controller and replace that refresh command with a row hammer refresh command. In this example, refresh control circuit 140 may provide row address RXADD responsive to a row hammer refresh event. Refresh control circuit 140 is described more fully below with reference to FIG. 1C.

Memory device 100 may also include a test mode (TM) circuit 155 configured for generating and conveying one or more test mode signals, as described more fully below. As shown in FIG. 1A, TM circuit 155 may be coupled to address decoder 130, command decoder 150, row decoder 104, and refresh control circuit 140.

Clock signals CK and /CK may be received via clock terminals 114. A clock input circuit 170 may generate internal clock signals ICLK based on clock signals CK and /CK. Internal clock signals ICLK may be conveyed to various components of memory device 100, such as command decoder 150 and an internal clock generator 172. Internal clock generator 172 may generate internal clock signals LCLK, which may be conveyed to input/output circuit 162 (e.g., for controlling the operation timing of input/output circuit 162). Further, data mask terminals 118 may receive one or more data mask signals DM. When data mask signal DM is activated, overwrite of corresponding data may be prohibited.

Figure 1B:
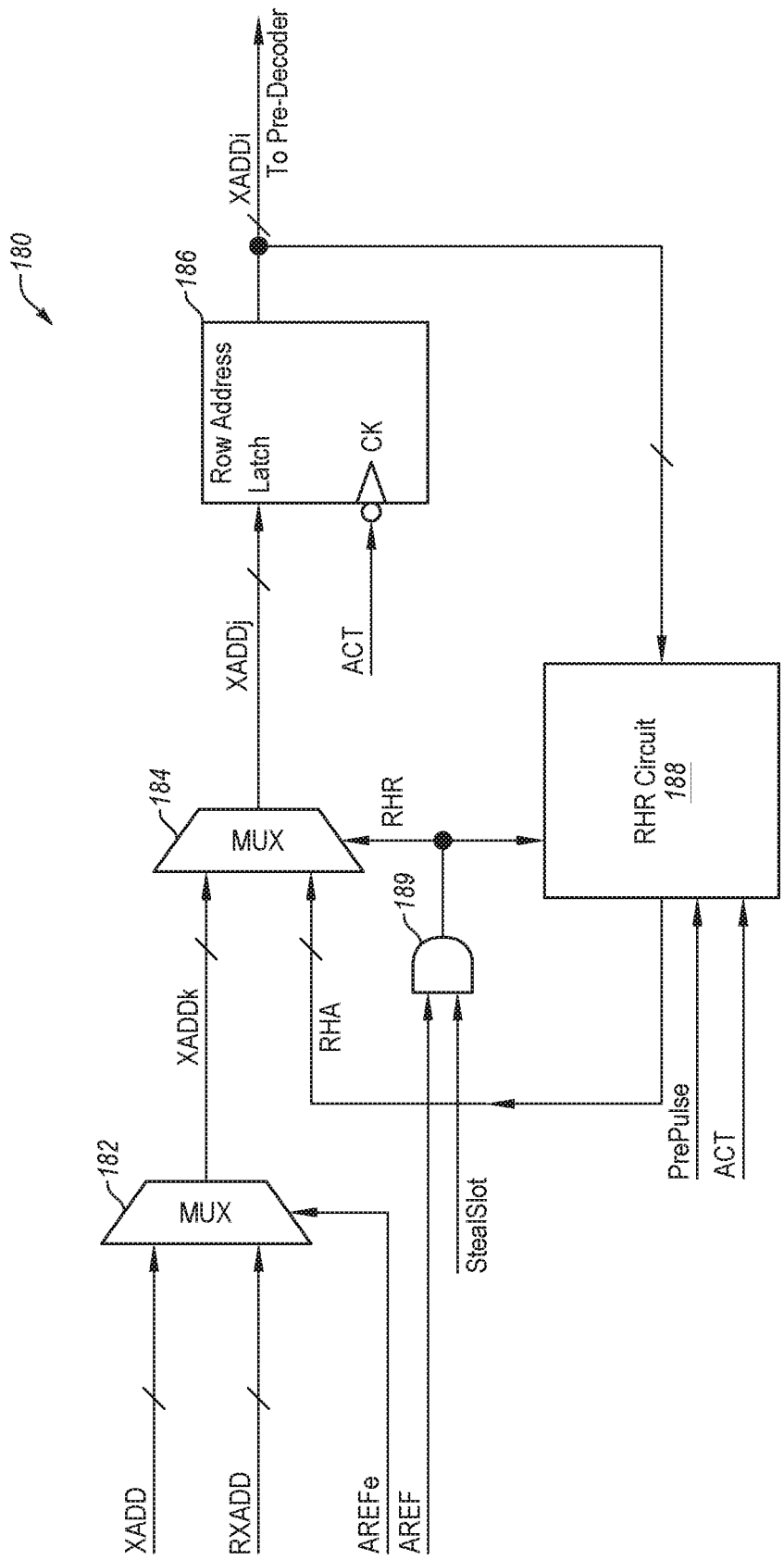
FIG. 1B depicts an example row decoder circuit, according to various embodiments of the present disclosure.

FIG. 1B depicts an example row decoder circuit 180, according to various embodiments of the present disclosure. For example, row decoder circuit 180 may be part of a row decoder of a memory device, such as row decoder 104 of FIG. 1A. Row decoder circuit 180, which is configured to convey a row address, includes a multiplexer 182, a multiplexer 184, a latch 186, a row hammer refresh (RHR) circuit 188, and a AND gate 189.

As illustrated, multiplexer 182 is configured to receive row address XADD (e.g., from an address decoder, such as address decoder 130 of FIG. 1A) and row address RXADD (e.g., from a control circuit, such as refresh control circuit 140 of FIG. 1A). Further, multiplexer 182, which is configured to select either row address XADD or row address RXADD based on a refresh command AREFe (e.g., an effective refresh command, as described more fully below), may output row address XADDk.

AND gate 189 is configured to receive refresh signal AREF (e.g., from command decoder 150; see FIG. 1A) and an instruction signal StealSlot (e.g., from refresh control circuit 140; see FIG. 1A). An output of AND gate 189, which may include a RHR signal, may be conveyed to multiplexer 184 and RHR circuit 188. More specifically, in response to a high refresh signal AREF and signal StealSlot, a high RHR signal may be provided to multiplexer 184 and RHR circuit 188.

In addition to receiving row address XADDk, multiplexer 184 may receive a row hammer address RHA from RHR circuit 188. Based on a received RHR signal, multiplexer 184 may output either row address XADDk or row hammer address RHA as row address XADDj, and row address XADDj may be received at latch 186 (e.g., a row address latch). Latch 186 is also configured to receive active signal ACT (e.g., an active signal pulse) (e.g., from command decoder 150; see FIG. 1A). Latch 186 may output row address XADDi in response to active signal ACT transitioning from high to low. Row address XADDi may be provided to, for example a pre-decoder (e.g., within a row decoder, such as row decoder 104; see FIG. 1A) and RHR circuit 188.

RHR circuit 188 is configured to receive row address XADDi, RHR signal RHR, active signal ACT and a pre-pulse signal PrePulse. RHR circuit 188 is configured to determine, based on row address sampling, row hammer address RHA, which is conveyed to multiplexer 184. In some embodiments, row hammer address RHA may be a neighbor address of a captured hammer address (e.g., RHR circuit 188 may determine and provide a neighbor address (i.e., of a hammered address) as row hammer address RHA).

Figure 1C:
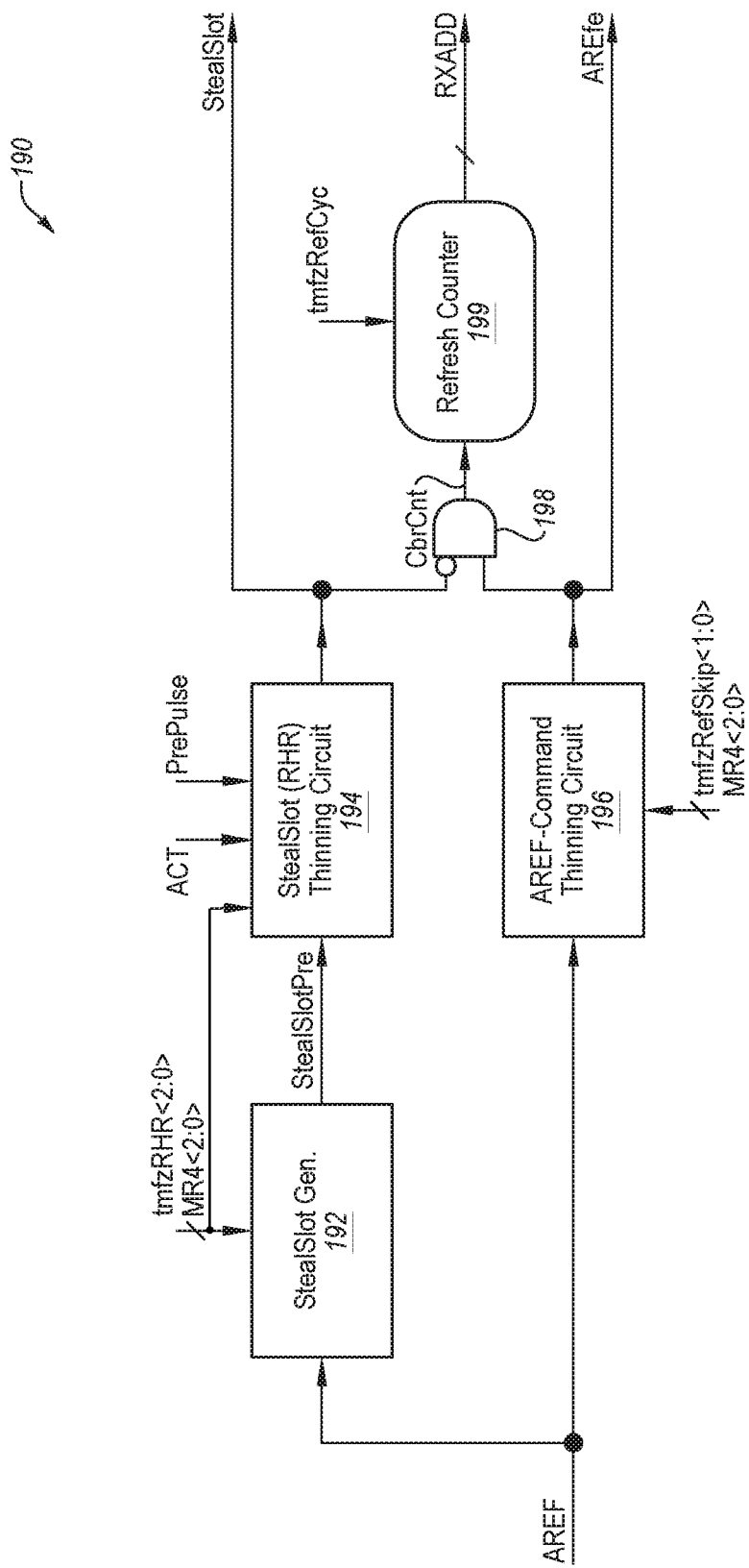
FIG. 1C depicts an example row hammer refresh circuit, according to various embodiments of the present disclosure.

FIG. 1C depicts an example row hammer refresh control circuit 190, according to various embodiments of the present disclosure. For example, row hammer refresh control circuit 190 may be part of refresh control circuit 140 shown in FIG. 1A. As shown in FIG. 1C, row hammer refresh control circuit 190 includes a StealSlot signal generator 192, a StealSlot thinning circuit 194, an AREF-command thinning circuit 196, an AND gate 198, and a refresh counter 199.

StealSlot signal generator 192, which receives auto refresh AREF (e.g., from command decoder 150; see FIG. 1A), test mode fuse bits (e.g., tmfzRHR<2:0>) (e.g., from TM 155; see FIG. 1A), and mode register bits (e.g., MR4<2:0>) (e.g., from register(s) 153; see FIG. 1A), is configured to generate a pre-instruction signal StealSlotPre. For example, tmfzRHR is a test-mode signal to set a grade of a RHH steal-rate, which may be determined with device immunity/performance for row-hammer.

StealSlot thinning circuit 194 is configured to receive pre-instruction signal StealSlotPre, active signal ACT, and pre-pulse signal PrePulse signal, and generate instruction signal StealSlot. As noted above, signal StealSlot may be received by row decoder circuit 180 of FIG. 1B. StealSlot signal generator 192 is described more fully below with reference to FIG. 9D, and StealSlot thinning circuit 194 is described more fully below with reference to FIG. 9F.

AREF-command thinning circuit 196, which receives auto refresh AREF (e.g., from command decoder 150; see FIG. 1A), test mode fuse bits (e.g., tmfzRefSkip<2:0>(i.e., a test mode signal to adjust a skip rate for an AREF command)) (e.g., from TM 155; see FIG. 1A), and mode register bits (e.g., MR4<2:0>) (e.g., from register(s) 153; see FIG. 1A), is configured to generate effective auto refresh AREFe, which may vary based on one or more parameters (e.g., temperature and/or an amount of activity) of an associated memory device. As shown in FIG. 1B, effective auto refresh AREFe may be received at row decoder circuit 180. AREF-command thinning circuit 196 is described more fully below with reference to FIGS. 7A and 7B. AND gate 198, which includes an inverted input, is configured to receive instruction signal StealSlot and auto refresh AREFe, and generate a CAS before RAS (CBR) count signal CbrCnt that may be received by refresh counter 199. Refresh counter 199, which may include a CBR counter, is configured to receive test mode fuse signal tmfzRefCyc (e.g., a test mode signal to adjust refresh cycle) and generate row address RXADD, which may be provided to row decoder circuit 180 FIG. 1B.

Figure 2:
FIG. 2 depicts a table including example refresh intervals for memory device temperatures, and associated multi-bit words for programming the refresh intervals of a memory device.

FIG. 2 is a table 200 depicting example refresh intervals for example memory device temperatures, and associated multi-bit words for programming (e.g., via a mode register (MR)) the refresh interval of a memory device (e.g., a DDR5). As shown in table 200, for memory device temperatures around 85° Celsius (C.) or less, an effective refresh command interval (tREFIe) of a memory device (e.g., memory device 100 of FIG. 1A) may be equal to 1X, wherein X is a default refresh command interval (e.g., such that a refresh occurs every 3.9 microseconds). Further, for memory device temperatures around or above 85° C., an effective refresh command interval (tREFIe) of the memory device may be increased to 0.5X (e.g., a refresh occurs every 1.95 microseconds). Although a refresh command interval of a memory device may be decreased at higher temperatures (e.g., temperatures greater than 85° C.), in this example, an effective refresh command interval (tREFIe) is not increased at lower temperatures (e.g., temperatures around or less than 85° C.). It is noted that in this example, the refresh command intervals are set by an external controller (e.g., a controller external to memory device 100 of FIG. 1A).

Figure 3:
FIG. 3 illustrates a table depicting example refresh intervals and associated multi-bit words for programming refresh intervals of a low power memory device.

FIG. 3 illustrates another table 300 depicting example refresh intervals and associated multi-bit words for programming (e.g., via a mode register) refresh interval of a low power (LP) memory device (e.g., LP4). As shown in table 300, the LP memory device may be set to one a number of effective refresh command interval times (tREFe). It is noted that in this example, the refresh intervals are set by an external controller (e.g., a controller external to memory device 100 of FIG. 1A).

Various embodiments of the disclosure relate to programming one or more settings of a memory device to adjust a refresh interval (i.e., and therefore an internal refresh rate) of the memory device, a number of wordlines selected for each refresh operation performed by the memory device, and/or a number of a refresh operations to be skipped (i.e., for every X number of refresh commands). In other words, a memory device may be programmed to operate in one of a number of modes (e.g., via one or more internal settings (e.g., register settings)). In comparison to conventional devices, systems, and/or methods, which may adjust a refresh rate (e.g., auto refresh and row hammer refresh rate) based on a signal from an external controller (i.e., external to a memory device), various embodiments may include programming one or more settings internal to a memory device that may allow the memory device to adjust one or more operational rates (e.g., auto refresh interval, refresh rate, auto refresh skip rate, and/or row hammer refresh rate) based on a temperature of the memory device. In some embodiments, one or more settings may be programmed via a test mode fuse. For example, according to some embodiments, an internal setting, referred to herein as "test mode fuse refresh range" ("tmfzRefRange" or "tmfzRefCyc") may be set to either a logic 1 or a logic 0. Based on the value of tmfzRefCyc, a refresh interval may be set. For example, with reference to a table 400 illustrated in FIG. 4, if tmfzRefCyc is set to 0, a refresh period may be, for example, 32 milliseconds, and a number of rows selected for refresh may be set to 8. Further, if tmfzRefCyc is set to 1, a refresh period may be, for example, 64 milliseconds, and a number of rows selected for refresh may be set to 4.

Further, according to various embodiments, another internal setting, referred to herein as "test mode fuse skip rate" ("tmfzRefRate" or "tmfzRefSkip") may be set to either a logic 1 or a logic 0. Based on the value of tmfzRefSkip and tmfzRefCyc, a default refresh interval may be set. For example, with reference to table 500 shown in FIG. 5, if tmfzRefSkip and tmfzRefCyc are both set to 0, a refresh period may be, for example, 32 milliseconds, and a pumps sequence on 8 AREFs may be 8-8-8-8-8-8-8-8 (i.e., for every 8 refresh commands, 8 refreshes are executed). Further, if tmfzRefSkip is set to 1 and tmfzRefCyc are is set to 0, a refresh period may be, for example, 64 milliseconds, and a pumps sequence on 8 AREFs may be 8-x-8-x-8-x-8-x (i.e., for every 8 refresh commands, 4 refreshes are executed).

With continued reference to table 500, if tmfzRefSkip is set to 0 and tmfzRefCyc is set to 1, a refresh period may be, for example, 64 milliseconds and a pumps sequence on 8 AREFs may be 4-4-4-4-4-4-4-4 (i.e., for every 8 refresh commands, 8 refreshes are executed). Further, if tmfzRefSkip and tmfzRefCyc are both set to 1, a refresh period may be, for example, 128 milliseconds, and a pumps sequence on 8 AREFs may be 4-x-4-x-4-x-4-x (i.e., for every 8 refresh commands, 4 refreshes are executed).

As noted above, various embodiments disclosed herein relate to adjusting one or more refresh intervals, periods, and/or rates (e.g., auto refresh period, a row hammer refresh rate, and/or a skip rate) of a memory device based on a temperature of the memory device. FIG. 6 is a table 600 depicting various refresh intervals and settings for a memory device at various temperatures. For example, at a first temperature range (e.g., T>=60° C.), tmfzRefRange and tmfzRefRate may be both set to 0, a refresh period (also referred to herein as an "interval") may be 32 milliseconds, and a pumps sequence may be 8-8-8-8-8-8-8-8 (i.e., for every 8 refresh commands, 8 refreshes are executed). As another example, at the first temperature range (e.g., T>=60° C.), tmfzRefRange may be set to 0 and tmfzRefRate may be set to 1, a refresh period may be 64 milliseconds, and a pumps sequence may be 8-x-8-x-8-x-8-x (i.e., for every 8 refresh commands, 4 refreshes are executed).

With continued reference to the first temperature range (e.g., T>=60° C.), in another example, tmfzRefCyc may be set to 1 and tmfzRefSkip may be set to 0, a refresh period may be 64 milliseconds, and a pumps sequence may be 4-4-4-4-4-4-4-4 (i.e., no refreshes are skipped). Further, as another example, at the first temperature range (e.g., T>=60° C.), tmfzRefCyc and tmfzRefSkip may be both set to 1, a refresh period may be 128 milliseconds, and a pumps sequence may be 4-x-4-x-4-x-4-x (i.e., 1 of 2 refreshes are skipped).

For example, at a second temperature range (e.g., 60° C.>=T>=35° C.), tmfzRefCyc and tmfzRefSkip may be both set to 0, a refresh period may be 48 milliseconds, and a pumps sequence may be 8-8-x-8-8-x-8-8 (i.e., 1 of 3 refreshes are skipped). Further, at the second temperature range (e.g., 60° C.>=T>=35° C.), in another example, tmfzRefCyc may be set to 0 and tmfzRefSkip may be set to 1, a refresh period may be 96 milliseconds, and a pumps sequence may be 8-x-x-8-x-x-8-x (i.e., 2 of 3 refreshes are skipped).

With continued reference to the second temperature range (e.g., 60°>=T>=35°), as yet another example, tmfzRefCyc may be set to 1 and tmfzRefSkip may be set to 0, a refresh period may be 96 milliseconds, and a pumps sequence may be 4-4-x-4-4-x-4-4 (i.e., 1 of 3 refreshes are skipped). Further, at the second temperature range (e.g., 60° C.>=T>=35° C.), as yet another example, tmfzRefCyc and tmfzRefSkip may be both set to 1, and a refresh interval may be 192 milliseconds, and a pumps sequence may be 4-x-x-4-x-x-4-x (i.e., 2 of 3 refreshes are skipped).

Moreover, at a third temperature range (e.g., 35° C.>=T), tmfzRefCyc and tmfzRefSkip may both be set to 0, a refresh period may be 64 milliseconds, and a pumps sequence may be 8-x-8-x-8-x-8-x (i.e., 1 of 2 refreshes are skipped). Further, as another example, at the third temperature range (e.g., 35° C.>=T), tmfzRefCyc may be set to 0 and tmfzRefSkip may be set to 1, a refresh interval may be 128 milliseconds, and a pumps sequence may be 8-x-x-x-8-x-x-x (i.e., 3 of 4 refreshes are skipped).

With continued reference to the third temperature range (e.g., 35°>=T), in another example, tmfzRefCyc may be set to 1 and tmfzRefSkip may be set to 0, a refresh period may be 128 milliseconds, and a pumps sequence may be 4-x-4-x-4-x-4-x. Further, in this example, 1 of 2 refreshes are skipped. Further, at the third temperature range (e.g., 35° C. >=T), as yet another example, tmfzRefCyc and tmfzRefSkip may both be set to 1, a refresh period may be 256 milliseconds, and a pumps sequence may be 4-x-x-x-4-x-x-x (i.e., 3 of 4 refreshes are skipped). It is noted that the temperature values, refresh periods, skip rates, and pumps sequences disclosed above with reference to FIGS. 4-6 are provided as examples, and the disclosure is not limited to any actual values. Rather, other temperature values, refresh periods, skip rates, and/or pumps sequences are within the scope of the disclosure.

In various embodiments, a memory device may be programmed (e.g., via one or more internal settings) to operate in one of a number of modes, wherein each mode may be associated with a different auto refresh skip rate. For example, in a first mode, 1 of 3 (or 4 of 12) refresh operations may be skipped. In a second mode, 1 of 2 (or 6 of 12) refresh operations may be skipped. In a third mode, 2 of 3 (or 8 of 12) refresh operations may be skipped, and in a fourth mode, 3 of 4 (or 9 of 12) refresh operations may be skipped.

Figure 7A:
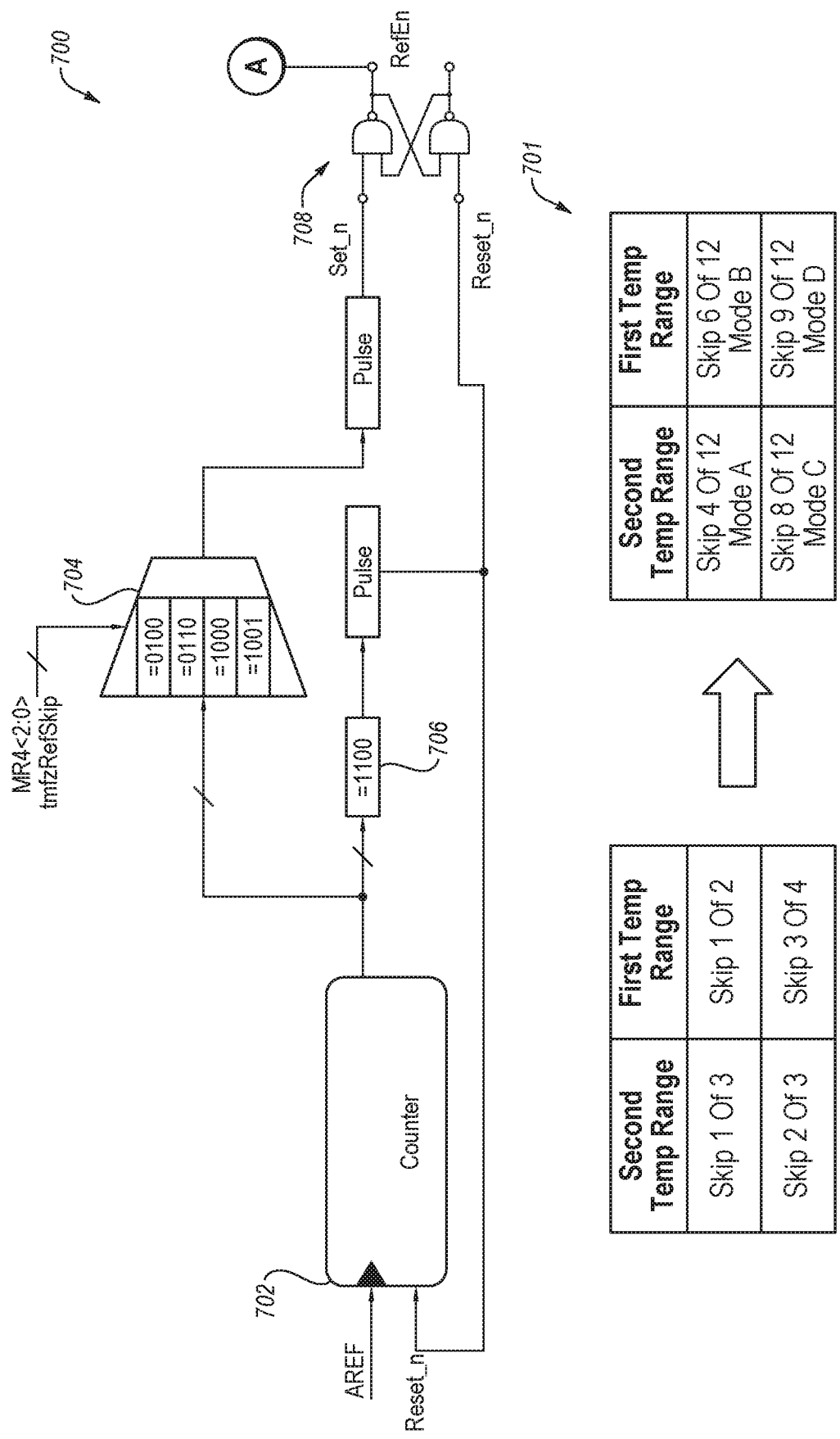
FIGS. 7A and 7B depict an example circuit for implementing a variable refresh skip rate for a memory device, according to various embodiments of the disclosure.
Figure 7B:
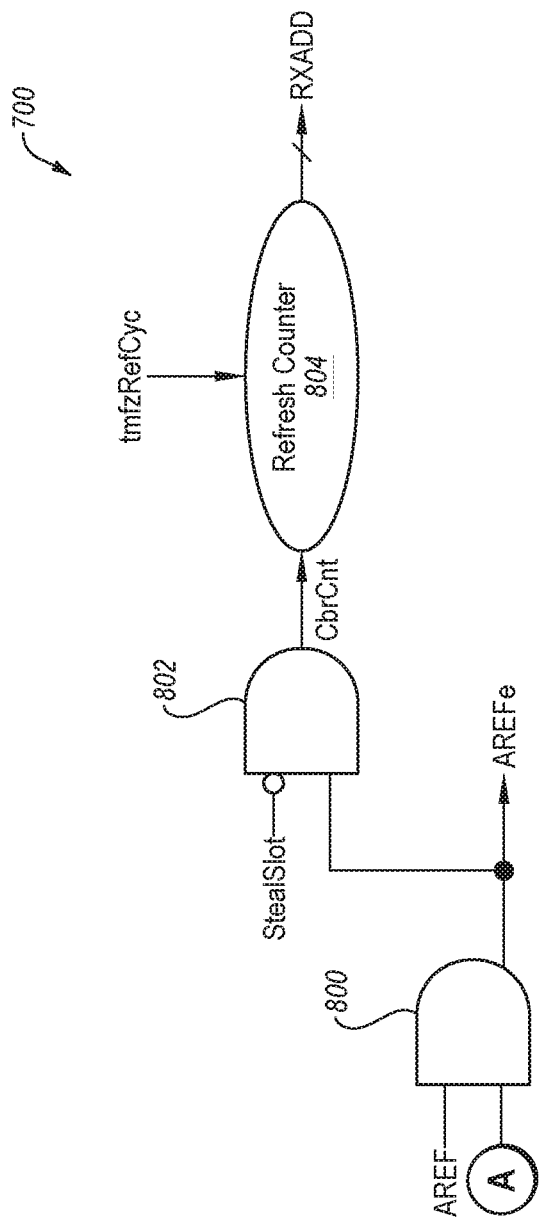

FIGS. 7A and 7B depict an example circuit 700 for implementing a variable refresh skip rate for a memory device, according to various embodiments of the disclosure. Circuit 700 may also be referred to herein as an "AREF-command thinning circuit," and thinning circuit 196 shown in FIG. 1C may include all or a portion of circuit 700. In some embodiments, each memory bank of a memory device (e.g., memory device 100 of FIG. 1A) may include a dedicated circuit 700. In other embodiments, circuit 700 may be associated with more than one memory bank of a memory device. For example, refresh control circuit 140 of FIG. 1A may include circuit 700. FIG. 7A further depicts a table 701 illustrating various modes (i.e., Mode A-Mode D) and associated skip rates.

Circuit 700 includes a counter 702, a component 704, a component 706, and a flip-flop 708. For example, each of component 704 and component 706 may include a decoder (e.g., a 4 bit decoder) and/or a multiplexer. More specifically, for example, each of component 704 and component 706 may include decoder and multiplexer unit. As illustrated, counter 702, which may include an N bit (e.g., 4 bit) counter, is configured to receive refresh command AREF and a reset signal Reset_n. In some embodiments, refresh command AREF may include a refresh signal generated via a column decoder (e.g., command decoder 150 of FIG. 1A).

An output of counter 702 is coupled to each of component 704 and component 706. As described more fully below, each of component 704 and component 706 may be configured based on a mode of operation of an associated memory device. More specifically, component 704 and component 706 may be configured based on a temperature and/or an amount of activity of a memory device. An output of component 706, which is configured to generate reset signal Reset_n, is coupled to an input of counter 702. Further, an output of component 704 is coupled to flip-flop 708, which is configured to generate an enable signal RefEn.

Circuit 700 further includes an AND gate 800, an AND gate 802, and a refresh counter 804. In response to receipt of an asserted refresh command AREF and an asserted RefEn signal, an effective refresh command AREFe may be generated via AND gate 800. If RefEn signal is low upon receipt of an asserted refresh command AREF, effective refresh command AREFe generated via AND gate 800 may be low. AND gate 802, which includes an inverted input, is configured to receive refresh command AREFe and instruction signal StealSlot, and generate signal CbrCnt. Refresh counter 804 is configured to receive an output of AND gate 802 and tmfzRefCyc (e.g., from TM 155 of FIG. 1A), and generate row address RXADD. Row address RXADD may be provided to a row decoder, such as row decoder 104 shown in FIG. 1A. As will be appreciated, in some embodiments, AREF-command thinning circuit 196 of FIG. 1C may include counter 702, component 704, component 706, flip-flop 708, and AND gate 800. Further, AND gate 198 of FIG. 1C may include AND gate 802, and refresh counter 199 of FIG. 1C may include refresh counter 804. During a contemplated operation of circuit 700, counter 702 is configured to generate a count <3:0>, which is incremented for each received refresh command AREF. Count <3:0> may be conveyed to component 704 and component 706. If the value of count <3:0> is equal to a programmed value of component 704, component 704 may generate a pulse signal (e.g., a low pulse signal), which may be received at flip-flop 708. As will be appreciated, a pulse signal received at flip-flop 708 may cause flip-flop 708 to generate a high enable signal RefEn. Similarly, if the value of count <3:0> is equal to a programmed value of component 706, component 706 may generate a pulse signal (e.g., a low pulse signal). In response to a pulse signal generated by component 706, counter 702 may be reset via reset signal Reset_n.

Values of component 704 and component 706 may be set based on a desired mode of operation (e.g., Mode A, Mode B, Mode C, and Mode D shown in table 701). In other words, a value of component 704 and a value of component 706 may be set based on a desired auto refresh skip rate (e.g., skip 1 of 3, skip 2 of 3, skip 1 of 4, skip 2 of 4, skip 3 of 4, skip 4 of 12, skip 6 of 12, skip 8 of 12, skip 9 of 12, etc.). For example, a value of component 704 may be set to a number of refreshes to skip (i.e., for a number of desired cycles in a refresh interval). Further, a value of component 706 may be set to the number of desired cycles in the refresh interval. For example, to skip 4 of 12 (i.e., skip 4 refresh operations for every 12 refresh commands; Mode A), a value of component 704 may be set to 4 (e.g., "0100"), and a value of component 706 may be set to 12 (e.g., "1100"). To skip 6 of 12 (i.e., skip 6 refresh operations for every 12 refresh commands; Mode B), a value of component may be set to 6 (e.g., "0110"), and a value of component 706 may be set to 12 (e.g., "1100"). To skip 8 of 12 (i.e., skip 8 refresh operations for every 12 refresh commands; Mode C), a value of component 704 may be set to 8 (e.g., "1000"), and a value of component 706 may be set to 12 (e.g., "1100"). To skip 9 of 12 (i.e., skip 9 refresh operations for every 12 refresh commands; Mode D), a value of component 704 may be set to 9 (e.g., "1001"), and a value of component 706 may be set to 12 (e.g., "1100"). As another example, to skip 1 of 3 (i.e., skip 1 refresh operations for every 3 refresh commands), a value of component 704 may be set to 1 (e.g., "0001"), and a value of component 706 may be set to 3 (e.g., "0011"). As yet another example, to skip 3 of 4 (i.e., skip 3 refresh operations for every 4 refresh commands), a value of component 704 may be set to 3 (e.g., "0011"), and a value of component 706 may be set to 4 (e.g., "0100").

Figure 8:
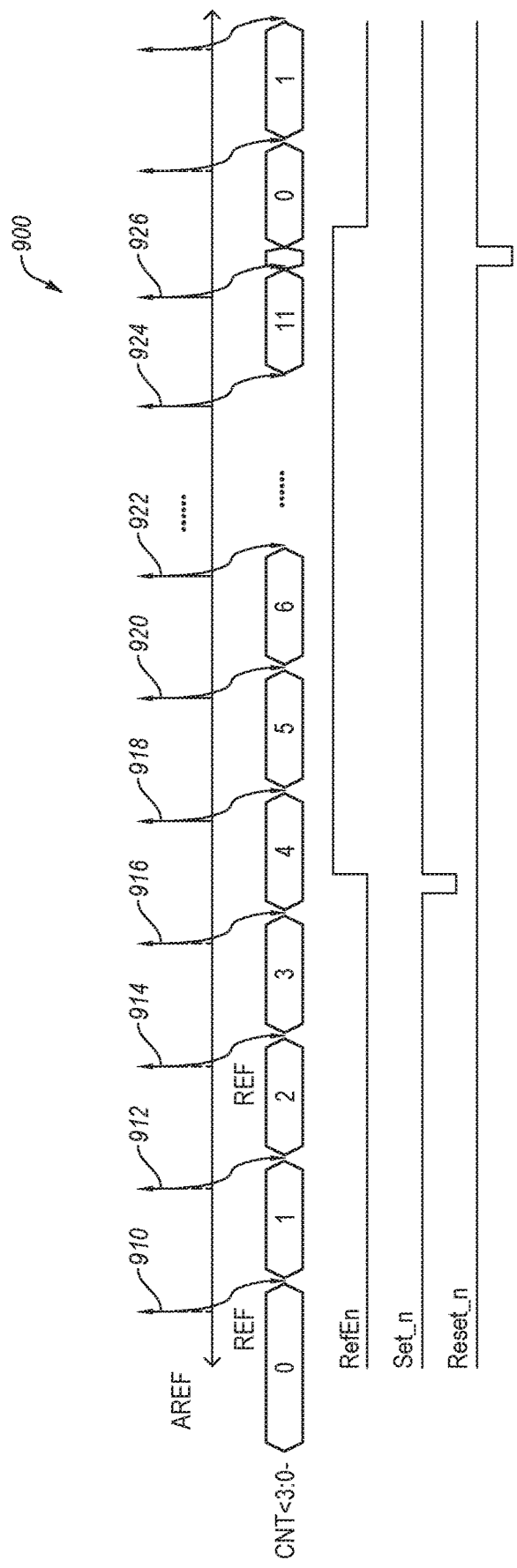
FIG. 8 is a timing diagram including a number of internal refresh commands, in accordance with various embodiments of the present disclosure.

An example operation of circuit 700 will now be described with reference to FIGS. 7A, 7B, and 8, which illustrates a timing diagram 900 including various internal refresh commands, counter values, and enable signal RefEn. In this example, counter 702 is a 4-bit counter, and a mode of a memory device is selected such that 4 of 12 refresh commands are skipped. Thus, in this example, a value of component 704 is set to 4 (i.e., "0100"), and a value of component 706 is set to 12 (i.e., "1100").

Initially, counter 702 includes a cnt <3:0> of 0000, and thus neither component 704 nor component 706 generates a pulse (e.g., a low pulse). Accordingly, counter 702 is not reset, enable signal RefEn is low, and therefore refresh signal 910 received while cnt <3:0> is 0000 may be skipped. Continuing with this example, upon receipt of refresh signal 910, cnt <3:0> of counter 702 may be incremented to 0001, and thus neither component 704 nor component 706 generates a pulse. Accordingly, counter 702 is not reset, enable signal RefEn is low, and therefore refresh signal 912 received while cnt <3:0> is 0001 may be skipped. Further, upon receipt of refresh signal 912, cnt <3:0> of counter 702 may be incremented to 0010, and thus neither component 704 nor component 706 generates a low pulse. Accordingly, counter 702 is not reset, enable signal RefEn is low, and therefore refresh signal 914 received while cnt <3:0> is 0010 may be skipped. Upon receipt of refresh signal 914, cnt <3:0> of counter 702 may be incremented to 0011, and thus neither component 704 nor component 706 generates a low pulse. Accordingly, counter 702 is not reset, enable signal RefEn is low, and therefore refresh signal 916 received while cnt <3:0> is 0011 may be skipped.

Upon receipt of refresh signal 916, cnt <3:0> of counter 702 may be incremented to 0100. In this example, counter 702 is not reset; however component 704 generates a pulse (e.g., a low pulse (i.e., Set n includes a low pulse)). Accordingly, enable signal RefEn transitions high, effective refresh command AREFe is asserted, and therefore refresh signal 918 received while cnt <3:0> is 0100 is not skipped. Further, for each subsequent refresh signal (i.e., refresh signal 920, refresh signal 922, refresh signal 924, and refresh signal 926) prior to counter 702 incrementing to 1100, enable signal RefEn may be high, and therefore each subsequent refresh signal (i.e., refresh signal 920, refresh signal 922, refresh signal 924, and refresh signal 926) may not be skipped.

Upon receipt of refresh signal 926, cnt <3:0> of counter 702 may be incremented to 1100, and thus component 706 may generate a pulse (e.g., a low pulse (i.e., Reset_n includes a low pulse)), which may reset counter 702. As illustrated, flip-flop 708 is configured to receive reset signal Reset_n, and thus the pulse generated by component 706 may reset flip-flop 708 and enable signal RefEn may transition low.

Figure 9A:
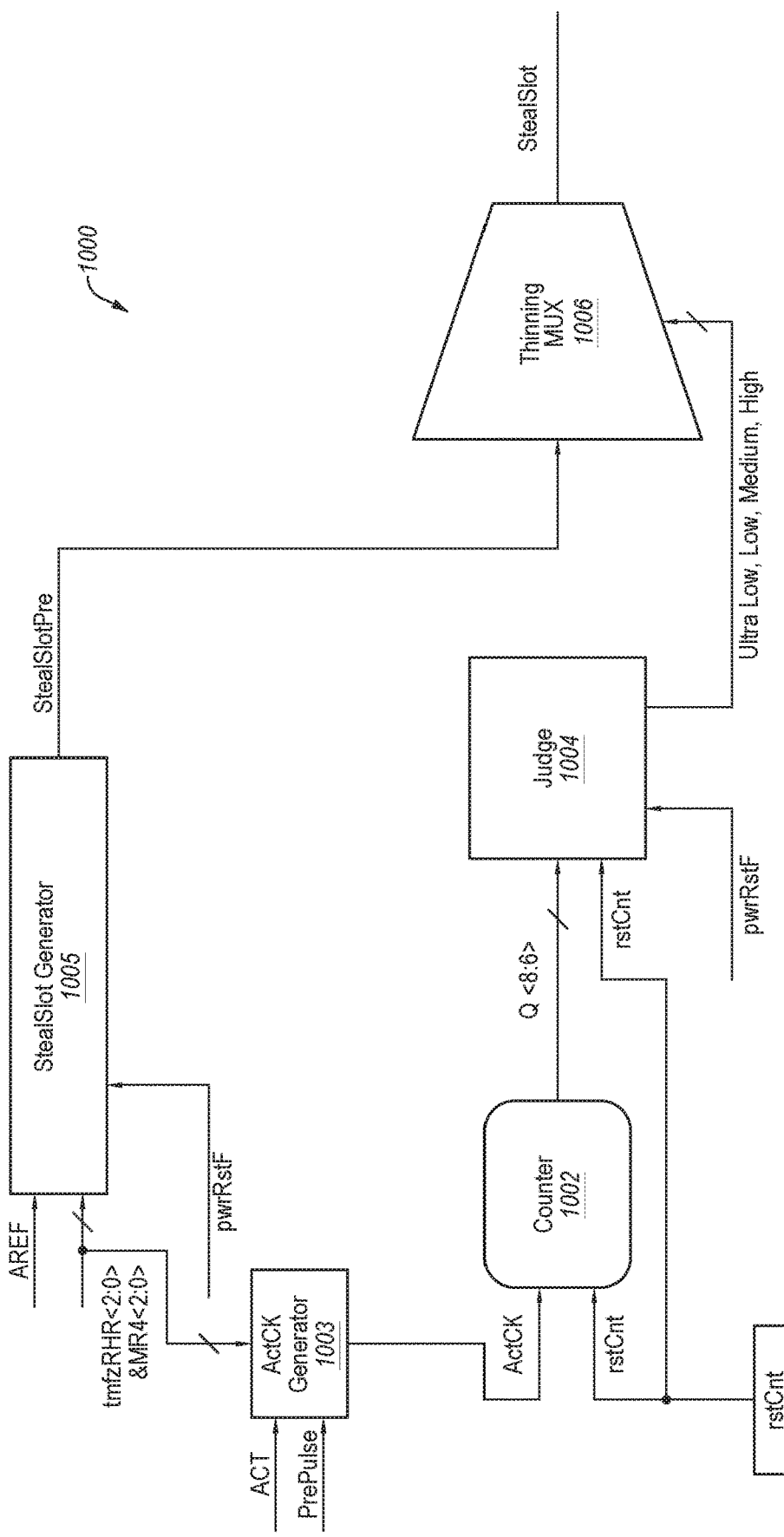
FIG. 9A depicts an example of a controller for generating a StealSlot signal for a memory device, according to one or more embodiments of the present disclosure.

As noted above, some embodiments of the disclosure relate to setting a row hammer refresh steal rate for a memory device based on a temperature of the memory device and/or an amount of activity at the memory device. FIG. 9A depicts an example controller 1000 for generating signal StealSlot, according to one or more embodiments of the present disclosure. In some embodiments, each memory bank of a memory device may include a dedicated controller 1000. In other embodiments, controller 1000 may be associated with more than one memory bank of a memory device. For example, refresh control circuit 140 of FIG. 1A may include controller 1000.

Controller 1000, which is configured to generate signal StealSlot, includes a reset count generator (rstCntGen) 1001, a counter 1002, an active clock generator 1003, a count detector (also referred to herein as a "judge") 1004, a StealSlot signal generator 1005, and a thinning MUX 1006. For example, StealSlot thinning circuit 194 of FIG. 1C may include rstCntGen 1001, counter 1002, active clock generator 1003, count detector 1004, and thinning MUX 1006.

Figure 9B:
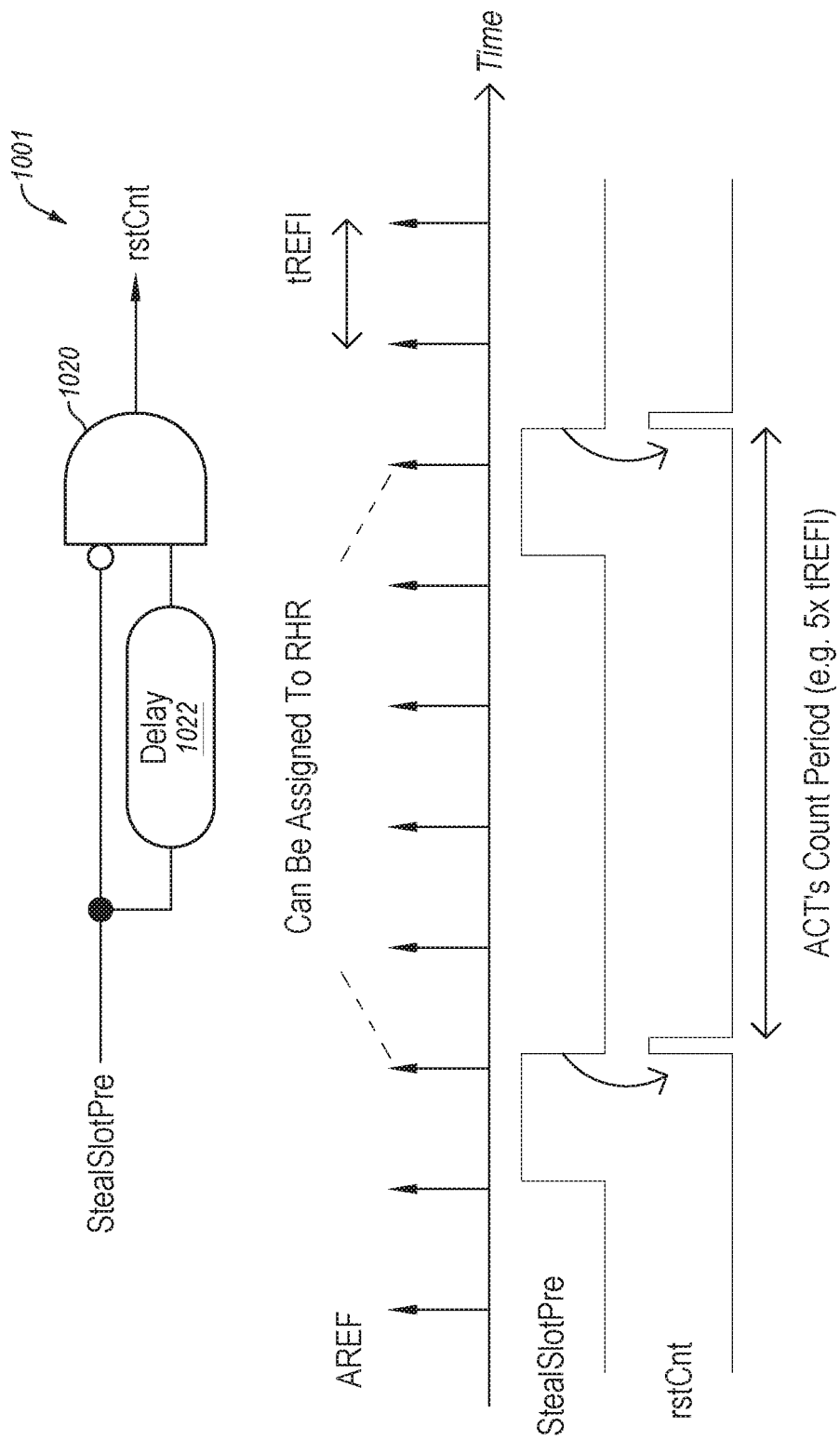
FIG. 9B depicts an example of a reset count generator, in accordance with various embodiments of the present disclosure.

Reset count generator 1001 is configured to generate a reset signal rstCnt that may be received at counter 1002 and count detector 1004. FIG. 9B is a more detailed illustration of reset count generator 1001. As shown in FIG. 9B, reset count generator 1001 includes an AND gate 1020 and a delay element 1022. One input of AND gate 1020 includes an inverted input and is configured to receive signal StealSlotPre. Another input of AND gate 1020 is configured to receive signal StealSlotPre via delay element 1022. As shown in FIG. 9B, in response to signal StealSlotPre transitioning low, a reset signal rstCnt may include a pulse.

With reference again to FIG. 9A, StealSlot signal generator 1005 may be configured to receive auto refresh AREF, test mode fuse bits (e.g., tmfzRHR<2:0>) (e.g., from TM 155; see FIG. 1A), and mode register bits (e.g., MR4<2:0>) (e.g., from register(s) 153; see FIG. 1A). StealSlot signal generator 1005 may be also be configured to receive a signal pwrRstF (e.g., a reset signal which may be issued at power-on, and may be used for initializing a circuit at power-on). StealSlot signal generator 1005 may convey signal StealSlotPre to each of thinning MUX 1006 and reset count generator 1001.

Active clock generator 1003, which is configured to receive test mode fuse bits (e.g., tmfzRHR<2:0>) (e.g., from TM 155; see FIG. 1A), mode register bits (e.g., MR4<2:0>) (e.g., from register(s) 153; see FIG. 1A), active signal ACT, and pre-pulse signal PrePulse, may generate an active clock signal ActCK. For example, active clock generator 1003 may include active clock generator 1350 described below with reference to FIG. 12B.

According to some embodiments, counter 1002, which may be configured to receive active clock signal ActCK and reset signal rstCnt, may count a number of asserted active clock signals ActCK (e.g., received at a memory bank) during a sample period. In some embodiments, counter 1002 may be coupled to registers (not shown in FIG. 9A) that store row addresses and may be configured to count a number of times a number of rows of a memory bank have been accessed.

Based on a number of received asserted active clock signals, count detector 1004 may determine an activity level of the memory device, and more specifically, a memory bank of the memory device. The determined activity level may be used by thinning MUX 1006 to generate signal StealSlot.

As will be appreciated, a maximum number of asserted active signals may occur during a refresh interval tREFI. For example, during a single refresh interval tREFI, a maximum number of asserted active signals may be 98. As other examples, during five refresh intervals (i.e., 5 tREFI), a maximum number of asserted active signals may be 490, and during ten refresh intervals (i.e., 10 tREFI), a maximum number of asserted active signals may be 980. Further, according to some embodiments, a reference number of active signals for one or more refresh intervals (e.g., 1 tREFI, 5 tREFI, 10 tREFI, etc.) may be determined, wherein the reference number is a percentage (e.g., 10, %, 20%, 30%) of the maximum number of asserted active signals for the refresh interval. In some embodiments, if a number of received asserted active signals for a refresh interval is less than a reference number for the time interval, a row hammer refresh steal rate may be decreased, and in some embodiments, row hammer refresh operations may be stopped (e.g., for a time period) (i.e., if the number of received asserted active signals for the refresh interval is less than the reference number).

Further, in some embodiments, a row hammer refresh steal rate may be dynamically adjusted based on a number of received active signals during a refresh interval relative to the maximum number of asserted active signals for the refresh interval. For example, if a number of received active signals during a refresh interval is less than ½ of the maximum number of asserted active signals for the refresh interval, a steal rate may be reduced to, for example, ½ of a default steal rate. As another example, if a number of received active signals during a refresh interval is less than ¼ of the maximum number of asserted active signals for the refresh interval, a steal rate may be reduced to, for example, ¼ of a default steal rate. According to various embodiments, a row hammer refresh steal rate for a memory bank may be defined (e.g., set and/or adjusted) via one or more registers (e.g., a mode register) associated with the memory bank.

With reference to FIG. 10, a table 1100, depicting various passing rates (e.g., 1-skip rate) for a number of received asserted active signals, is illustrated. As depicted in table 1100, in response to a number of asserted active signals being less than approximately 64 for a time interval (e.g., 5 tREFI), an activity level may be determined (e.g., "Ultra Low"), and a passing rate may be set to (e.g., reduced to) 0X (e.g., via thinning MUX 1006 of FIG. 9A), wherein X is a default passing rate. As another example, in response to a number of asserted active signals being between approximately 64 and 127 for the time interval (e.g., 5 tREFI), the activity level may be determined (e.g., "Low"), and a passing rate may be set to (e.g., reduced to) ¼X (e.g., via thinning MUX 1006 of FIG. 9A). Further, in response to a number of asserted active signals being between approximately 128 and 255 for the time interval (e.g., 5 tREFI), the activity level may be determined (e.g., "Medium"), and a passing rate may be set to (e.g., reduced to) ½X (e.g., via thinning MUX 1006 of FIG. 9A). As yet another example, in response to a number of asserted active signals being between approximately 255 or greater for the time interval (e.g., 5 tREFI), the activity level may be determined (e.g., "High"), and a passing rate may be set to 1X (e.g., via thinning MUX 1006 of FIG. 9A). In these embodiments, counter 1002 of FIG. 9A may be reset via a signal rstCnt (e.g., at the end of a time interval, such as 1 tREFI, 5 tREFI, 10 tREFI, etc.).

As will be appreciated, bits <8:6> of a binary number (i.e., at least an 8-bit number) may be used to represent decimal numbers 64 to 255. According to some embodiments, counter 1002 (of FIG. 9A) may counter bits <8:6> of a binary number, and these bits may be used by count detector 1004 to identify an amount of activity. For example, FIG. 11 depicts an example timing diagram 1200 illustrating values of counter bit Q<6> (depicted via a waveform 1202), counter bit Q<7> (depicted via a waveform 1204), and counter bit Q<8> (depicted via a waveform 1206. As shown in timing diagram 1200, if each of counter bits Q<6>, Q<7>, and Q<8> are low, the number of received asserted active signals is less than 64 (e.g., for a time period), and the activity level (i.e., the amount of activity) may be "Ultra Low." Further, if bit Q<6> is high and each of bits Q<7> and Q<8> are low, the number of received asserted active signals is between 64 and 127 (e.g., for the time period), and the activity level may be "Low." Moreover, if bit Q<7> is high and bit Q<8> is low, the number of received asserted active signals is between 128 and 255 (e.g., for the time period), and the activity level may be "Medium." In addition, if bit Q<8> is high, the number of received asserted active signals is greater than 255 (e.g., for the time period), and the activity level may be "High." As noted above, based on the activity level of a memory bank, a steal rate of the memory bank may be set via (e.g., via thinning MUX 1006).

Figure 9C:
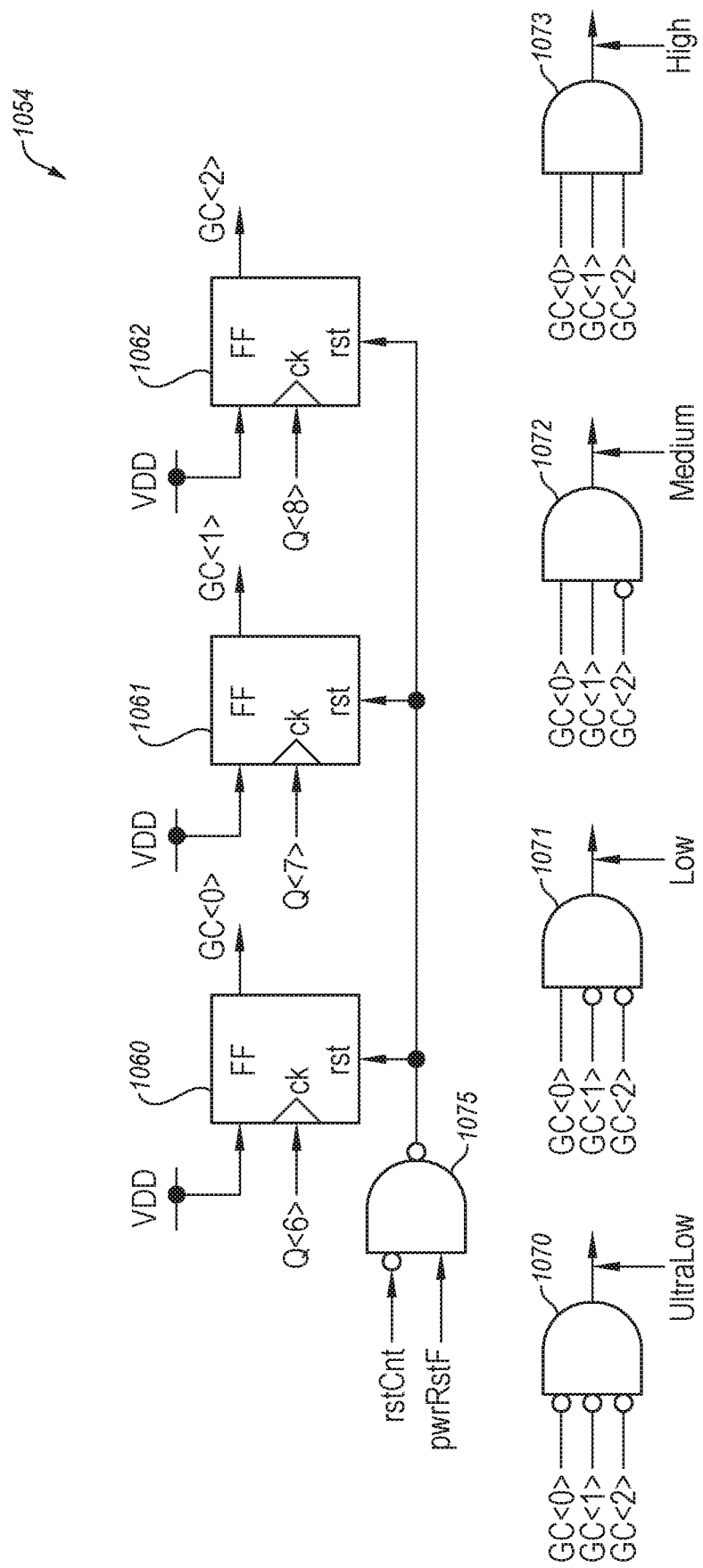
FIG. 9C illustrates an example of a count detector, according to various embodiments of the present disclosure.

FIG. 9C depicts an example count detector (also referred to herein as a "judge") 1054, according to one or more embodiments of the present disclosure. For example, count detector 1054 may include count detector 1004 of FIG. 10A. Count detector 1054 includes flip-flops 1060, 1061, and 1062, wherein each flip-flop is configured to receive a counter bit (e.g., Q<6>, Q<7>, or Q<8>, as described above) and generate an output GC<0:2>. Flip-flop outputs (i.e., GC<0>, GC<1>, GC<2>) may be received at a number of AND gates 1070, 1071, 1072, and 1073. In response to outputs GC<0>, GC<1>, GC<2>, one of an Ultra Low signal, a Low signal, a Medium signal, and a High signal (i.e., indicative of an activity level) may be generated and conveyed to thinning MUX 1006 (see FIG. 9A). Count detector 1054 further includes a NAND gate 1075 configured to receive reset signal rstCnt (e.g., from reset count generator 1001 of FIG. 9A) and signal pwrRstF and output a signal that may reset flip-flops 1060, 1061, and 1062.

Figure 9D:
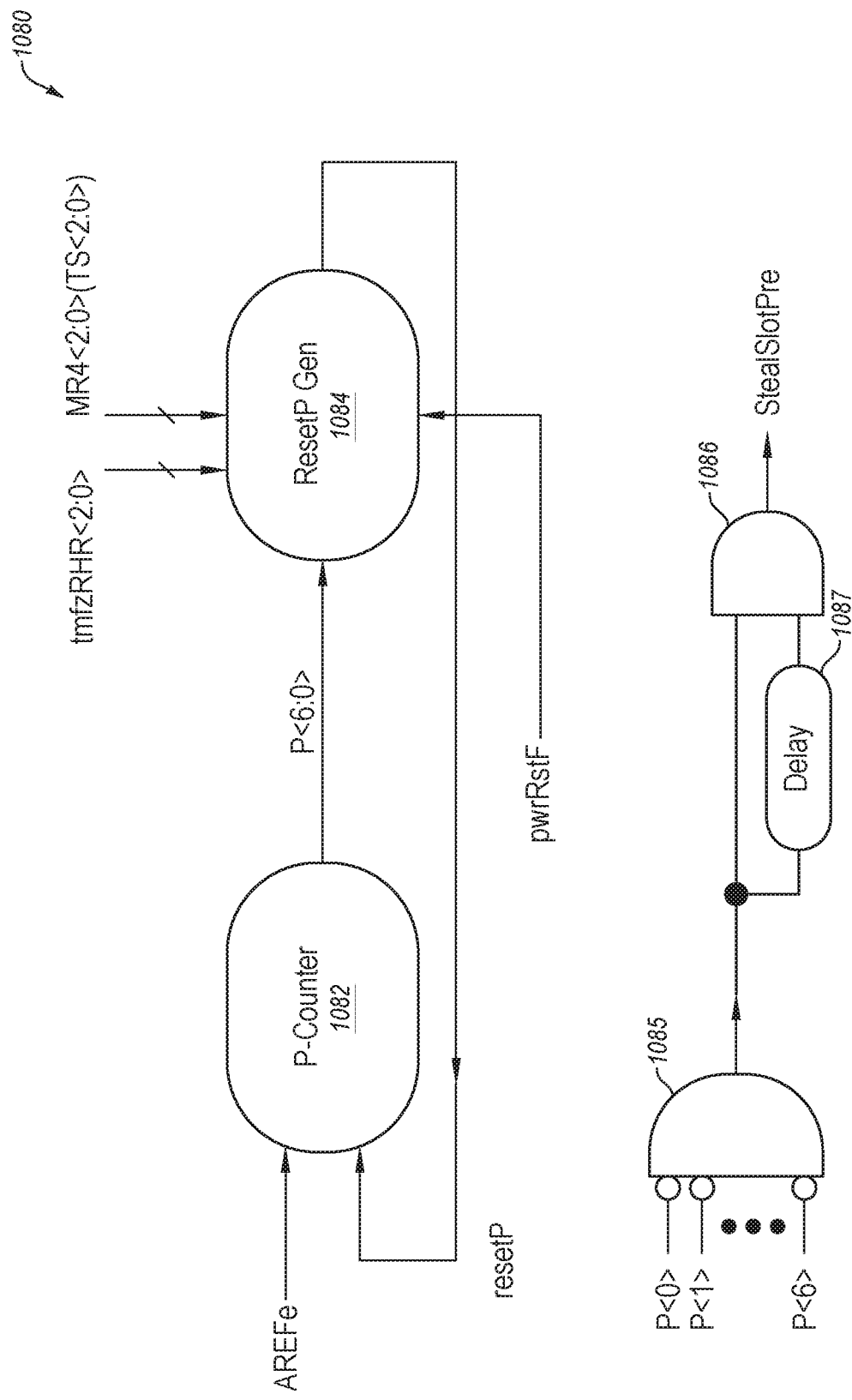
FIG. 9D depicts an example of a StealSlot signal generator, in accordance with various embodiments of the present disclosure.

FIG. 9D depicts an example StealSlot signal generator 1080, in accordance with various embodiments of the present disclosure. For example, StealSlot signal generator 1005 of FIG. 9A and/or StealSlot signal generator 192 of FIG. 1C may include StealSlot signal generator 1080. StealSlot signal generator 1080 includes a counter 1082 configured to receive auto refresh AREFe and a reset signal resetP, and output bits <6:0> based on a number of received auto refresh AREFe signals. StealSlot signal generator 1080 further includes a reset generator 1084 configured to receive bits <6:0>, test mode fuse bits (e.g., tmfzRHR<2:0>) (e.g., from TM 155; see FIG. 1A), mode register bits (e.g., MR4<2:0>) (e.g., from register(s) 153; see FIG. 1A), and signal pwrRstF. Reset generator 1084 is further configured to generate reset signal resetP, which may reset counter 1082.

Figure 9E:
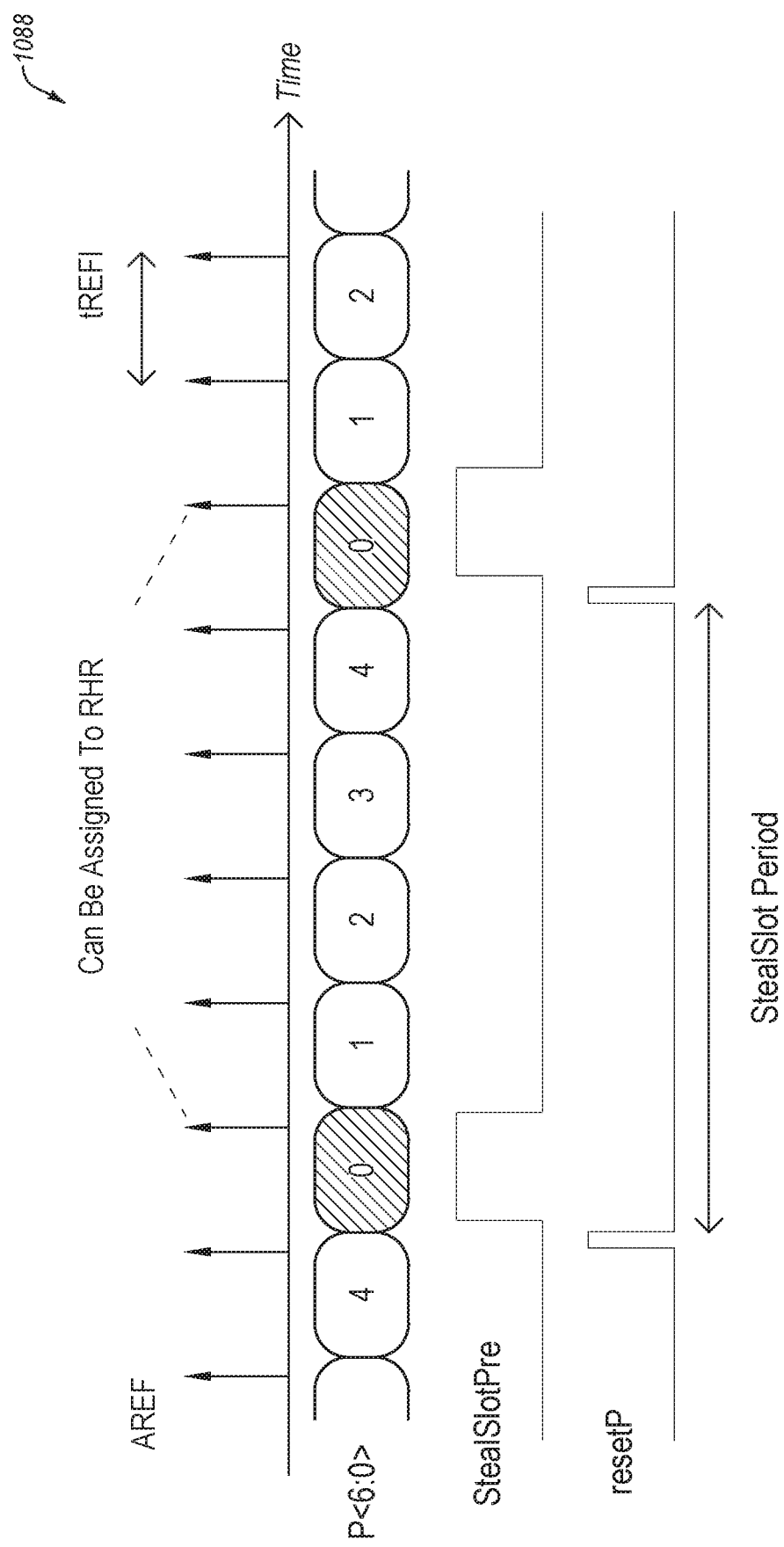
FIG. 9E includes a timing diagram showing example states of various signals of the StealSlot signal generator shown in FIG. 9D.

StealSlot signal generator 1080 further includes an AND gate 1085 including inverting inputs. AND gate 1085 is configured to receive bits <6:0>. An output of AND gate 1085 is coupled to one input of an AND gate 1086, and another input of AND gate 1086 is coupled to the output of AND gate 1085 via a delay element 1087. AND gate 1086 is configured to generate signal StealSlotPre. A timing diagram 1088 shown in FIG. 9E illustrates example states of various signals of StealSlot signal generator 1080 shown in FIG. 9D.

Figure 9F:
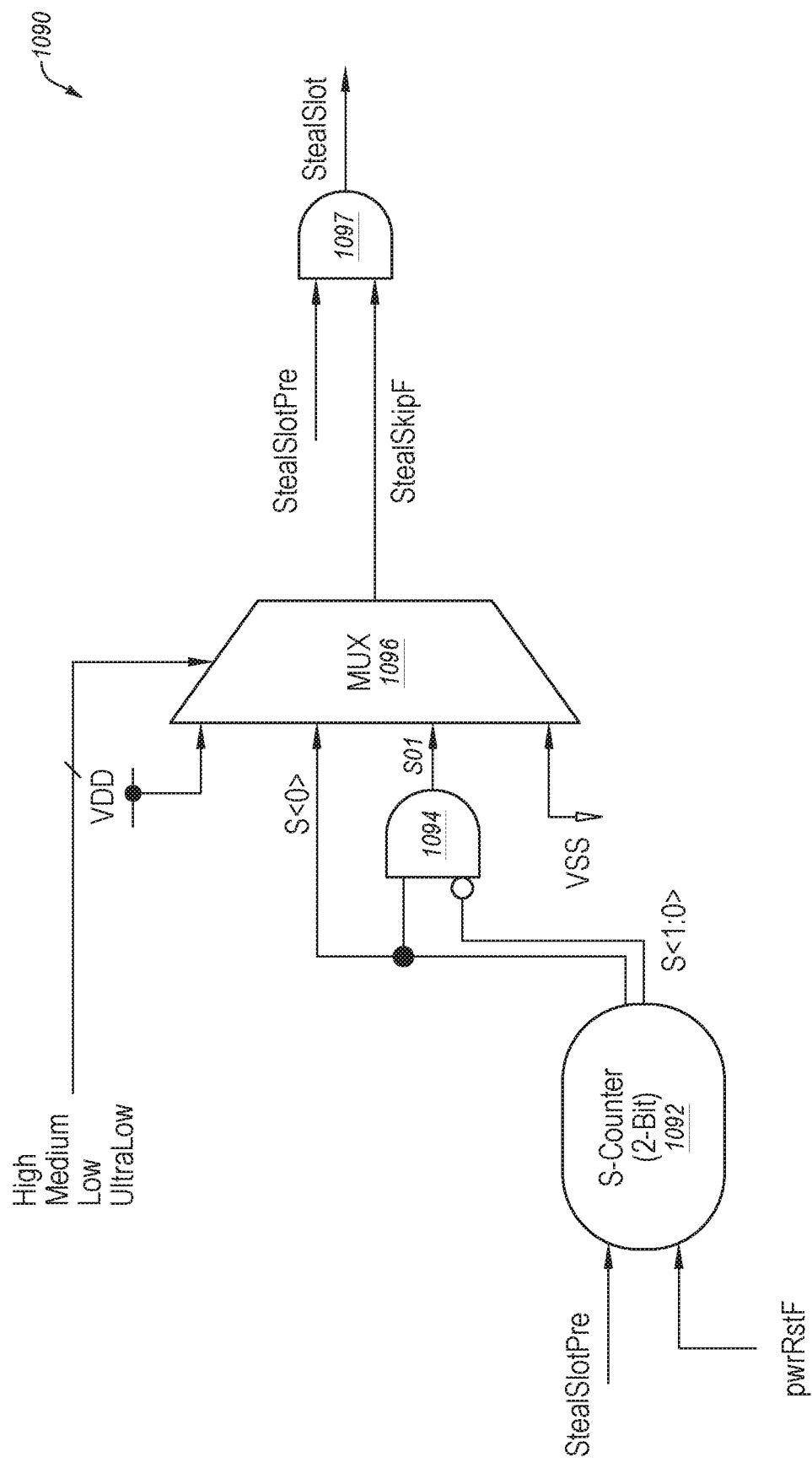
FIG. 9F illustrates an example of a StealSlot thinning component, in accordance with various embodiments of the present disclosure.

FIG. 9F depicts an example thinning MUX 1090, according to various embodiments of the present disclosure. For example, thinning MUX 1006 of FIG. 9A may include thinning MUX 1090. Thinning MUX 1090 includes a counter 1092 (e.g., 2-bit counter), an AND gate 1094, a multiplexer 1096, and an AND gate 1097.

Counter 1092 is configured to receive signal StealSlotPre and signal pwrRstF, and generate bits S<1:0> based on a number of asserted StealSlotPre signals. More specifically, counter 1092 may include one output configured to convey bit S<0> and another output configured to convey bits S<1:0>. AND gate 1094 is configured to receive bit S<0> at one input, and bits S<1:0> at another input, and generate signal S01.

Multiplexer 1096 is configured to receive a voltage VSS, signal S01, bit S<0> from counter 1092, a voltage VDD, and a select signal (e.g., from a count detector (e.g., count detector 1004) indicative of an activity level (e.g., Ultra Low, Low, Medium, High)). Based on the activity level, multiplexer 1096 may output either voltage VDD, voltage VSS, bit S<0> or signal S01 as a signal StealSkipF. For example, when the select signal "High" is asserted, voltage VDD is output as StealSkipF. Further, for example, when select signal "Medium" is asserted, bit S<0> is output as StealSkipF (e.g., the skip-rate is ½ since S<0> is LSB of S-Counter. Thus, the steal-rate will be reduced to a half of StealSlotPre). When select signal "Low" is asserted, signal S01 is output as StealSkipF (e.g., the skip-rate is ¾ since one only every 4 cycles is high. Thus, the steal-rate will be reduced to a quarter of StealSlotPre). When select signal "UltraLow" is asserted, voltage VSS is output as StealSkipF (e.g., the skip-rate is 100% since StealSkipF signal will be always low. Thus, the steal-rate will be reduced to zero).

Figure 9G:
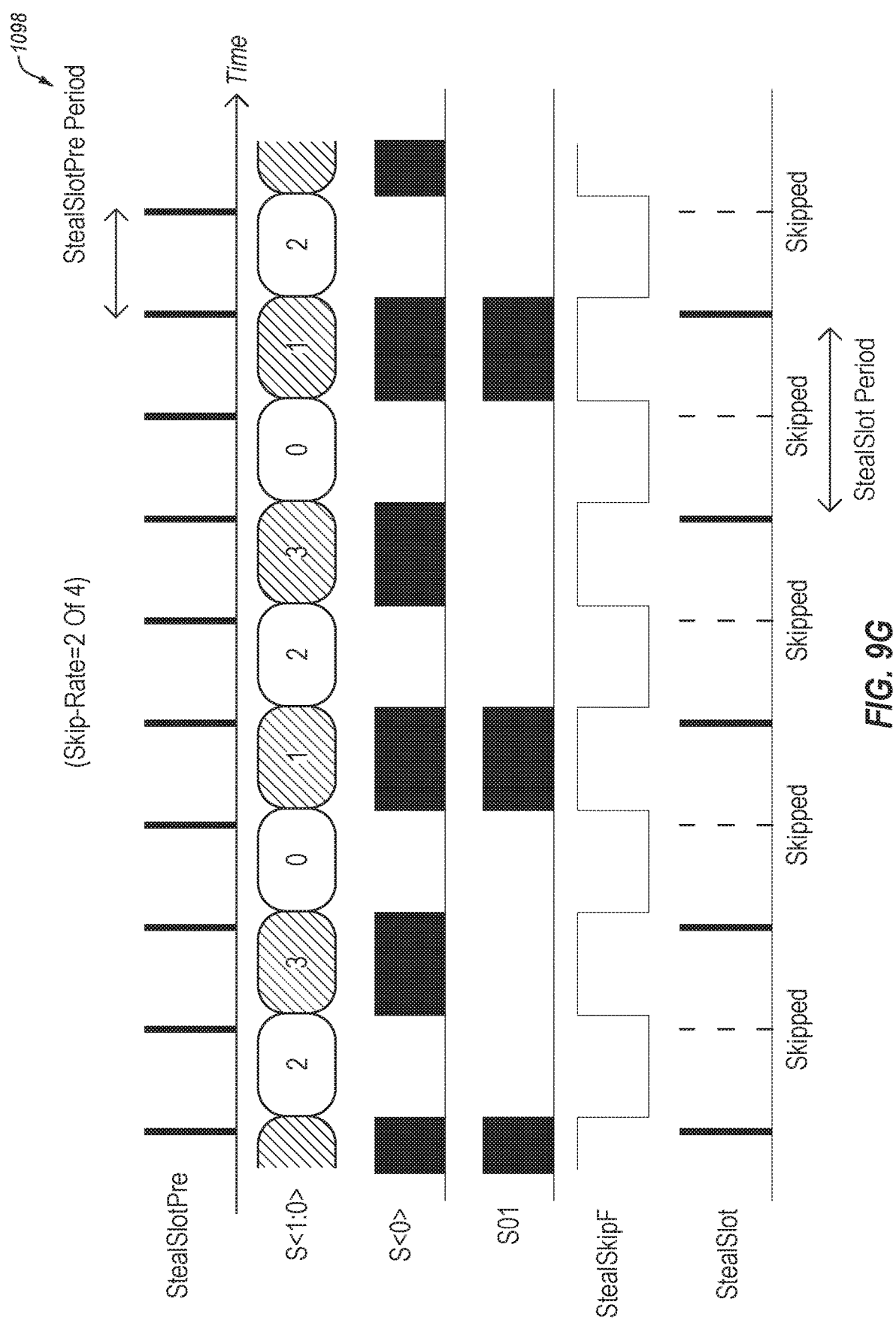
FIG. 9G includes a timing diagram showing example states of various signals of the StealSlot thinning component shown in FIG. 9F.

AND gate 1097, which may receive signal StealSkipF along with signal StealSlotPre, may to generate signal StealSlot. Signal StealSlot may be asserted if both signal StealSkipF and signal StealSlotPre are asserted. A timing diagram 1098 shown in FIG. 9G illustrates example states of various signals and bits of thinning MUX 1090 shown in FIG. 9F (e.g., with a skip rate of 2 of 4). As shown in timing diagram 1098, a StealSlot is skipped if StealSkipF is low upon receipt of a high StealSlotPre.

According to some embodiments, a row hammer refresh steal rate of a memory device be adjusted based on a temperature of the memory device. In some examples (e.g., including mobile DRAM), as disclosed herein, a refresh rate (e.g., an auto refresh rate) may be decreased at lower temperatures (e.g., below 85° C.). However, it may still be necessary to perform a certain number of row hammer refresh operations (e.g., due to an activity level of a memory device). Thus, in some embodiments, a row hammer refresh steal rate may be increased at lower temperatures, and therefore, in these embodiments, although an auto refresh rate may be decreased, and adequate number of row hammer refresh operations may still be performed.

In some embodiments, a row hammer fresh steal rate may be defined (e.g., set and/or adjusted) based on an operating temperature of a memory device and a level of activity of the memory device. More specifically, for example, in some embodiments, temperature data of a memory device may be read from, for example, a mode register (e.g., mode register 4 (MR4)) of the memory device. Further, the temperature data may be used to select a subset of bits of a number of counters bits (i.e., from a multi-bit word), and the subset of bits may be used to determine a row hammer refresh steal rate. In these embodiments, although an auto refresh rate is decreased at low temperatures, a row hammer refresh steal rate may be increased due to a lower threshold for activity levels.

Figure 12A:
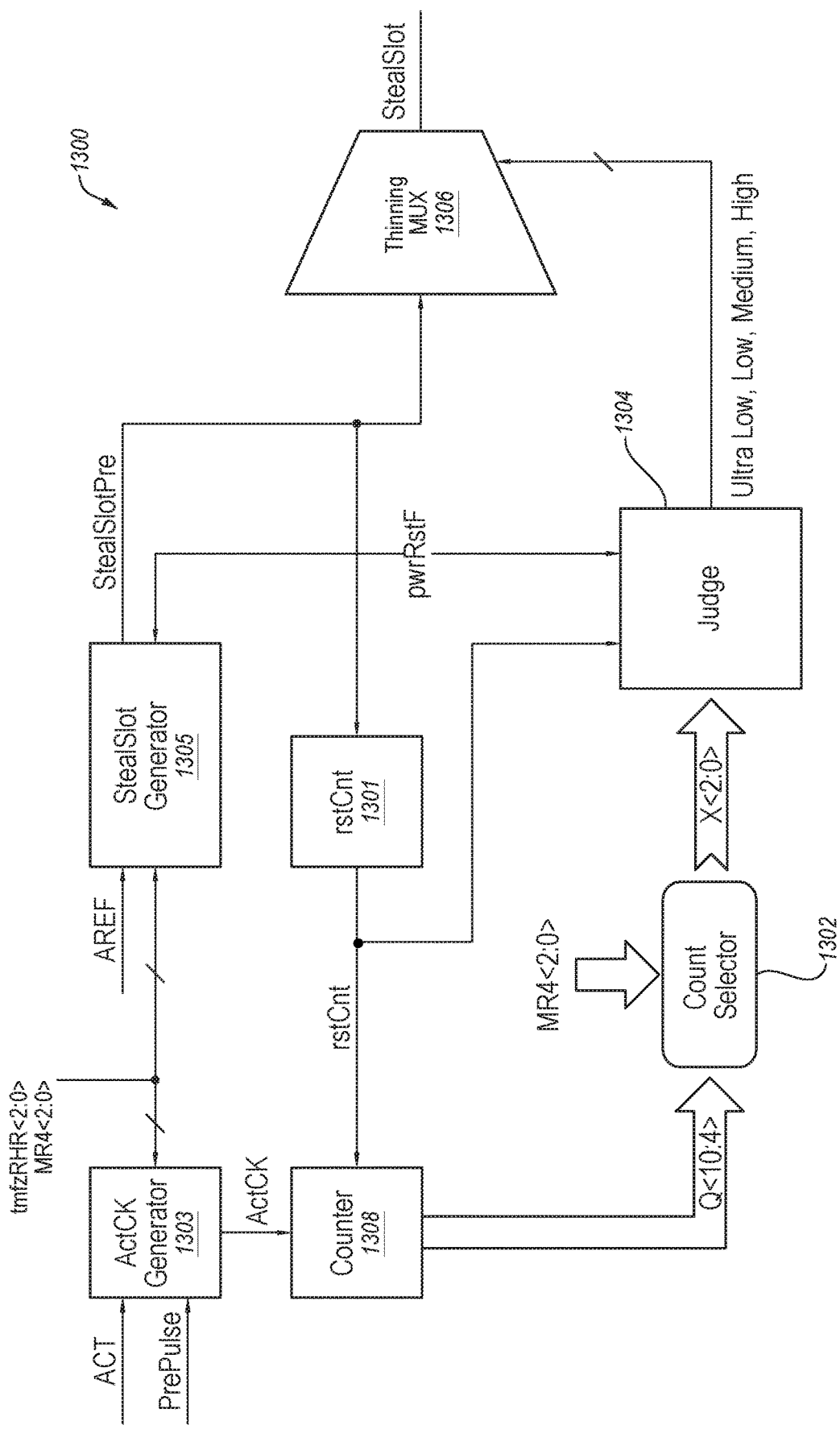
FIG. 12A depicts an example controller for generating a StealSlot signal for a memory device, according to one or more embodiments of the present disclosure.

FIG. 12A depicts an example controller 1300 for generating a row hammer refresh steal rate of a memory device, according to one or more embodiments of the present disclosure. In some embodiments, each memory bank of a memory device may include a dedicated controller 1300. In other embodiments, controller 1300 may be associated with more than one memory bank of a memory device. For example, refresh control circuit 140 of FIG. 1A may include controller 1300.

Controller 1300 includes a reset count generator (rstCntGen) 1301, a count selector 1302, an active clock generator 1303, a count detector (also referred to herein as a "judge") 1304, a StealSlot signal generator 1305, and a thinning MUX 1306. Controller 1300 further includes a counter 1308. For example only, StealSlot signal generator 1305 may include StealSlot signal generator 1005 of FIG. 9A, reset count generator 1301 may include reset count generator 1001 of FIG. 9A, counter 1308 may include counter 1002 of FIG. 9A, and count detector 1304 may include count detector 1004 of FIG. 9A. For example, StealSlot thinning circuit 194 of FIG. 1C may include rstCntGen 1301, count selector 1302, active clock generator 1303, count detector 1304, and thinning MUX 1306.

StealSlot signal generator 1305 may be configured to receive auto refresh AREF, test mode fuse bits (e.g., tmfzRHR<2:0>) (e.g., from TM 155; see FIG. 1A), and mode register bits (e.g., MR4<2:0>) (e.g., from register(s) 153; see FIG. 1A). StealSlot signal generator 1305 may also receive signal pwrRstF. StealSlot signal generator 1305 may be configured to convey signal StealSlotPre to thinning MUX 1306. Reset count generator 1301 may be configured to generate reset signal rstCnt, which may be received at counter 1308 and count detector 1304.

Active clock generator 1303, which is configured to receive test mode fuse bits (e.g., tmfzRHR<2:0>) (e.g., from TM 155; see FIG. 1A), mode register bits (e.g., MR4<2:0>) (e.g., from register(s) 153; see FIG. 1A), active signal ACT, and pre-pulse signal PrePulse, may generate active clock signal ActCK, which may be received by counter 1308. For example, active clock generator 1303 may include an active clock generator 1350 described below with reference to FIG. 12B.

Count selector 1302 may be configured to receive a multi-bit word. More specifically, count selector 1302 may be configured to receive counter bits Q<10:4> from a counter 1308 configured to count a number of asserted active signals received at an associated memory device.

Further, count selector 1302 may be configured to receive data (e.g., a number of bits) from a mode register (e.g., mode register 4 (MR4)) that are indicative of a temperature of the memory device. More specifically, for example, count selector 1302 may receive mode register bits MR4<2:0>. Further, based on the bits of MR4<2:0>, a subset of bits of the counter bits Q may be selected. For example, if the bits of MR4<2:0> indicate that the memory device is at a first temperature, a steal rate for the memory device may be based on a first number of bits of Q (e.g., Q<7:5>), which may be represented by X<2:0>. Further, if the bits of MR4<2:0> indicate that the memory device is at a second, different temperature, a steal rate for the memory device may be based on a second, different number of bits of Q (e.g., Q<10:8>), which may be represented by X<2:0>.

Figure 12B:
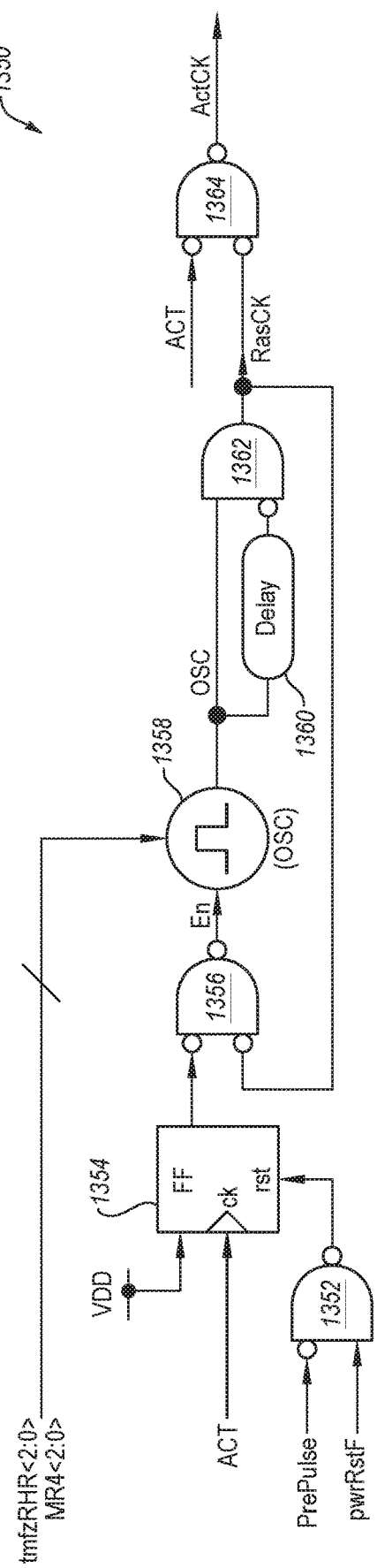
FIG. 12B depicts an example active clock generator, according to one or more embodiments of the present disclosure.

FIG. 12B depicts an example active clock generator 1350, according to various embodiments of the disclosure. For example, active clock generator 1350 may include active clock generator 1303 shown in FIG. 12A and/or active clock generator 1003 shown in FIG. 9A. Active clock generator 1350 includes a NAND gate 1352, a flip-flop 1354, a NAND gate 1356, an oscillator 1358, a delay element 1360, an AND gate 1362, and a NAND gate 1364.

NAND gate 1352 is configured to receive pre-pulse signal PrePulse and signal pwrRstF, and generate a signal that may reset flip-flop 1354. Flip-flop 1354 is configured to receive active signal ACT and an output of NAND gate 1352. An output of flip-flop 1354 is coupled to one input of NAND gate 1356, and another input of NAND gate 1356 is configured to receive a feedback signal from AND gate 1362. Oscillator 1358 is configured to receive an enable signal En from NAND gate 1356. Oscillator 1358 also receives test mode fuse bits (e.g., tmfzRHR<2:0>) (e.g., from TM 155; see FIG. 1A) and mode register bits (e.g., MR4<2:0>) (e.g., from register(s) 153; see FIG. 1A). Oscillator 1358 is configured to generate oscillator signal OSC. For example, a default oscillator (OSC) period may be set to 200 ns.

However, in some embodiments, tmfzRHR may be used to adjust the OSC period (e.g., due to the device performance of a "long time" activation issue). Further, MR4 may be used to adjust the OSC period with temperature information (e.g., since device performance of a long time activation issue may be changed by temperature).

Figure 12C:
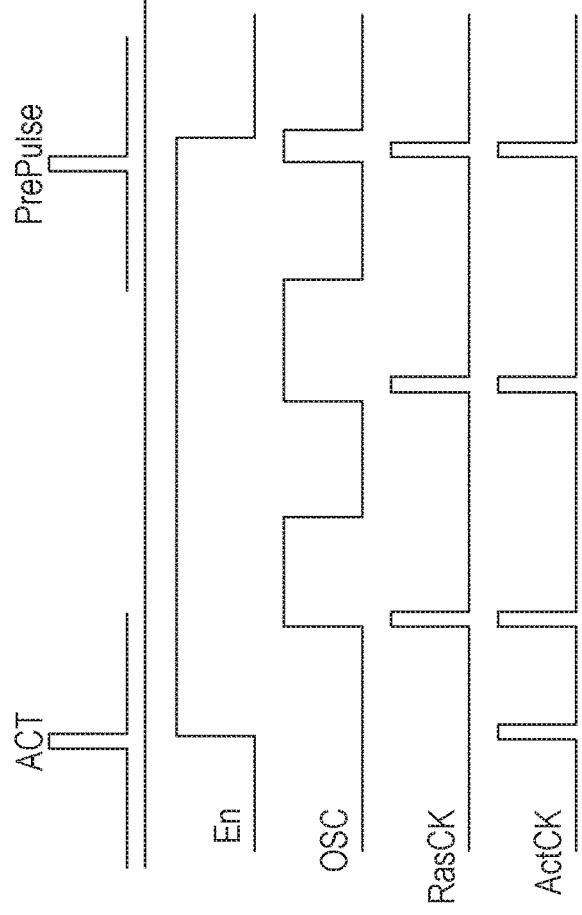
FIG. 12C includes a timing diagram showing example states of various signals of the active clock generator shown in FIG. 12B.

One input of AND gate 1362 is coupled to an output of oscillator 1358, and another input of AND gate 1362, which includes an inverted input, is coupled to the output of oscillator 1358 via delay element 1360. NAND gate 1364 is configured to receive active signal ACT at a first inverted input and signal RasCK from AND gate 1362 at a second inverted input. NAND gate 1364 is configured to generate active clock signal ActCK. A timing diagram 1370 shown in FIG. 12C illustrates example states of various signals of the active clock generator 1350 of FIG. 12B.

Figure 13:
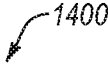
FIG. 13 depicts a table illustrating example bits of a multi-bit word that may be selected for various temperature ranges of a memory device, in accordance with various embodiments of the present disclosure.

FIG. 13 depicts an example table 1400 illustrating example counter bits Q that may be selected for various temperature ranges of a memory device. For example, if the bits of MR4<2:0> indicate that the memory device is 35° C.~60° C., bits Q<7:5> (i.e., count value of 32-128 for active signals) may be selected for determining a steal rate of the memory device. As another example, if the bits of MR4<2:0> indicate that the memory device is 85° C.~110° C., bits Q<9:7> (i.e., count value of 128-512 for active signals) may be selected for determining the steal rate of the memory device. As another example, if the bits of MR4<2:0> indicate that the memory device is <35° C., bits Q<6:4> (i.e., count value of 16-64 for active signals) may be selected for determining the steal rate of the memory device. Thus, for lower temperatures, lower count values may be used to determine the activity levels (e.g., Ultra Low, Low, Medium, High), and therefore a steal rate may be increased for lower temperatures.

Further, with reference again to FIG. 12A, similar to count detector 1004 of FIG. 9A, count detector 1304 may identify an activity level (e.g., Ultra Low, Low, Medium, High), which may be used by thinning MUX 1306 to select a steal rate.

FIGS. 14A and 14B shows another example table 1450 depicting various inputs (e.g., from test mode TM or mode register MR), temperature ranges, refresh intervals, AREF commands, steal-rates, and skip-rates. More specifically, portion 1452 of table 1450 depicts various example multi-bit words for programming test mode and/or mode register bits for various temperatures shown in portion 1454 of table 1450. Portion 1456 of table 1450 depicts various refresh interval settings based on tmfsRefSkip bits <1:0>. Portion 1458 of table 1450 depicts refresh intervals multipliers (e.g., 1×, 0.5×, 0.25×) and skip rates based on tmfzRefSkip bits <1:0>, and portion 1460 of table 1450 depicts various possible steal rates and skip rates based on an activity level (i.e., Ultra Low (UL), Low (L), Medium (M), and High (H)) of a memory device. More specifically, portion 1458 depicts a refresh command interval (tREFI) multiplier and skip rates for various temperatures (e.g., as shown in portion 1454), and portion 1460 illustrates various steal rates and skip rates based on activity levels and temperatures (e.g., as shown in portion 1454) of a memory device.

Figure 15:
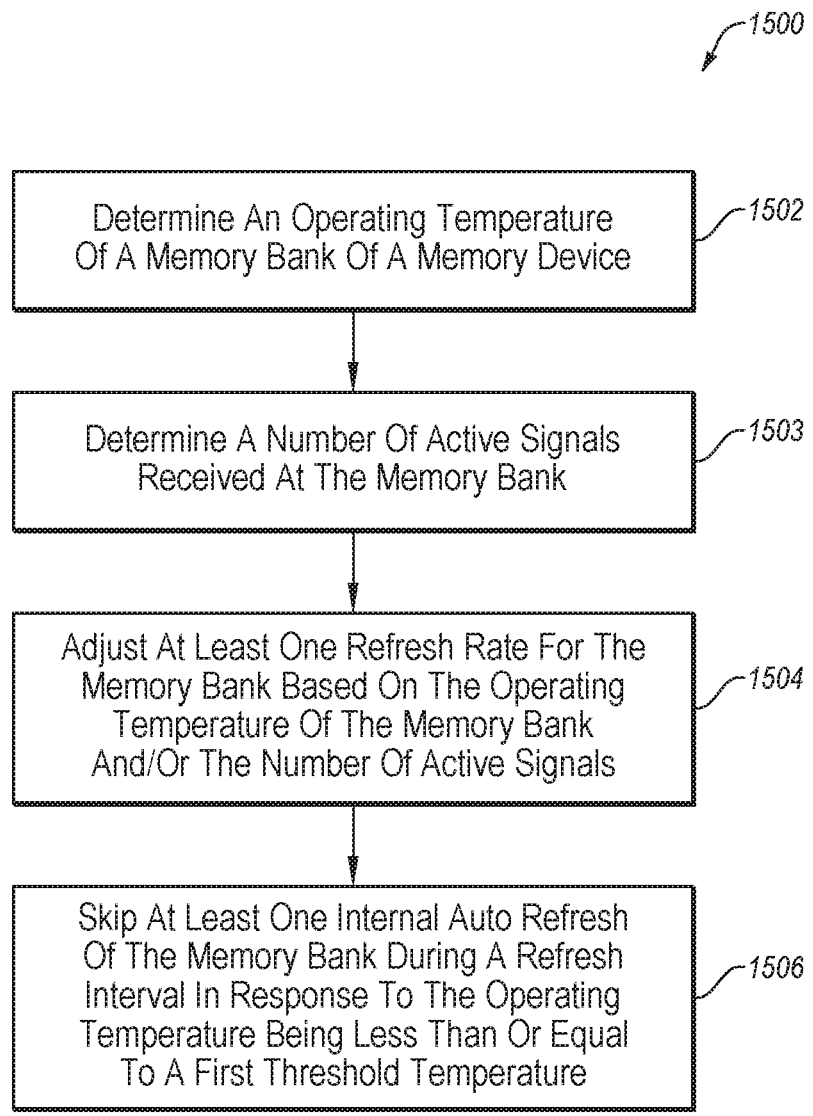
FIG. 15 is a flowchart of an example method of operating a memory device, in accordance with various embodiments of the present disclosure.

FIG. 15 is a flowchart of an example method 1500 of operating a memory device, in accordance with various embodiments of the disclosure. Method 1500 may be arranged in accordance with at least one embodiment described in the present disclosure. Method 1500 may be performed, in some embodiments, by a device or system, such as memory device 100 of FIG. 1A, circuit 700 of FIGS. 7A and 7B, controller 1000 of FIG. 9A, controller 1300 of FIG. 12A, memory device 1600 of FIG. 16, and/or electronic system 1700 of FIG. 17, or another device or system. Although illustrated as discrete blocks, various blocks may be divided into additional blocks, combined into fewer blocks, or eliminated, depending on the desired implementation.

Method 1500 may begin at block 1502, where an operating temperature of a memory bank of a memory device may be determined, and method 1500 may proceed to block 1503. For example, the operating temperature may be determined via a temperature sensor of the memory device and/or a mode register of the memory device.

In some embodiments, at block 1503, a number of active signals ("activation number") received at the memory bank may be determined, and method 1500 may proceed to block 1504.

At block 1504, at least one refresh rate for the memory bank may be adjusted based on the operating temperature of the memory bank and possibly the number of active signals, and method 1500 may proceed to block 1506. For example, an auto refresh rate may be adjusted and/or a row hammer refresh steal rate of the memory bank may be adjusted. For example, an auto refresh rate may be adjusted to 32 milliseconds, 48 milliseconds, 64 milliseconds, 96 milliseconds, 128 milliseconds, 192 milliseconds, 256 milliseconds, or any other rate. Further, for example, a row hammer refresh steal rate may be adjusted to zero, ¼ of a default rate, ½ of the default rate, the default rate, or to any other rate. In some embodiments, the operating temperature of the memory bank may be compared to one or more threshold temperatures to determine how to adjust the at least one refresh rate.

At block 1506, at least one internal auto refresh of the memory bank may be skipped in response to the operating temperature being less than or equal to a first threshold temperature. For example only, during a refresh interval including twelve cycles, four internal auto refreshes may be skipped, six internal auto refreshes may be skipped, eight internal auto refreshes may be skipped, or nine internal auto refreshes may be skipped. Further, for example, the first threshold temperature may be approximately 85° C., 60° C., 45° C., or any other temperature.

Modifications, additions, or omissions may be made to method 1500 without departing from the scope of the present disclosure. For example, the operations of method 1500 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, method may also include an act wherein a skip rate for auto refreshes for the memory bank may be set (e.g., based on the operating temperature and/or a refresh rate (e.g., auto refresh rate, row hammer refresh rate, or both) of the memory bank)). Moreover, for example, method 1500 may include an act of programming (e.g., via one or more test fuses, mode registers, etc.) one or more settings of the memory device that may be used to internally adjust, for example, a refresh rate and/or a skip rate of the memory device.

A memory device is also disclosed. According to various embodiments, the memory device may include one or more memory cell arrays, such as memory cell array 102 (see FIG. 1A). The one or more memory cell arrays may include a number of memory banks.

Figure 16:
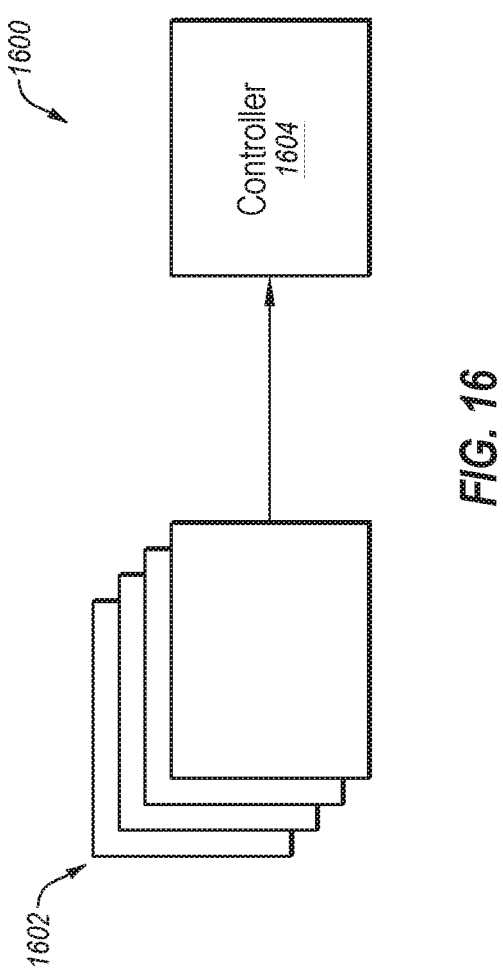
FIG. 16 is a simplified block diagram of an example memory device implemented according to one or more embodiments described herein.

FIG. 16 is a simplified block diagram of a memory device 1600 implemented according to one or more embodiments described herein. Memory device 1600, which may include, for example, a semiconductor device, includes a memory array 1602 and controller 1604. Memory array 1602, which may include a number of memory banks, may include a number of memory cells.

Controller 1604 may be operatively coupled with memory array 1602 so as to read, write, or refresh any or all memory cells within memory array 1602. Controller 1604 may be configured for carrying out one or more embodiments disclosed herein. For example, in some embodiments, controller 1604, which may include, for example, circuit 700 of FIGS. 7A and 7B, controller 1000 of FIG. 9A, and/or controller 1300 of FIG. 12A, may be configured to detect activity associated with a memory bank, determine an operating temperature associated with the memory bank, and/or control (e.g., define, set, and/or adjust) a refresh operation at the memory bank, in accordance with various embodiments disclosed herein.

A system is also disclosed. According to various embodiments, the system may include a memory device including a number of memory banks, each memory bank having an array of memory cells. Each memory cell may include an access transistor and a storage element operably coupled with the access transistor.

Figure 17:
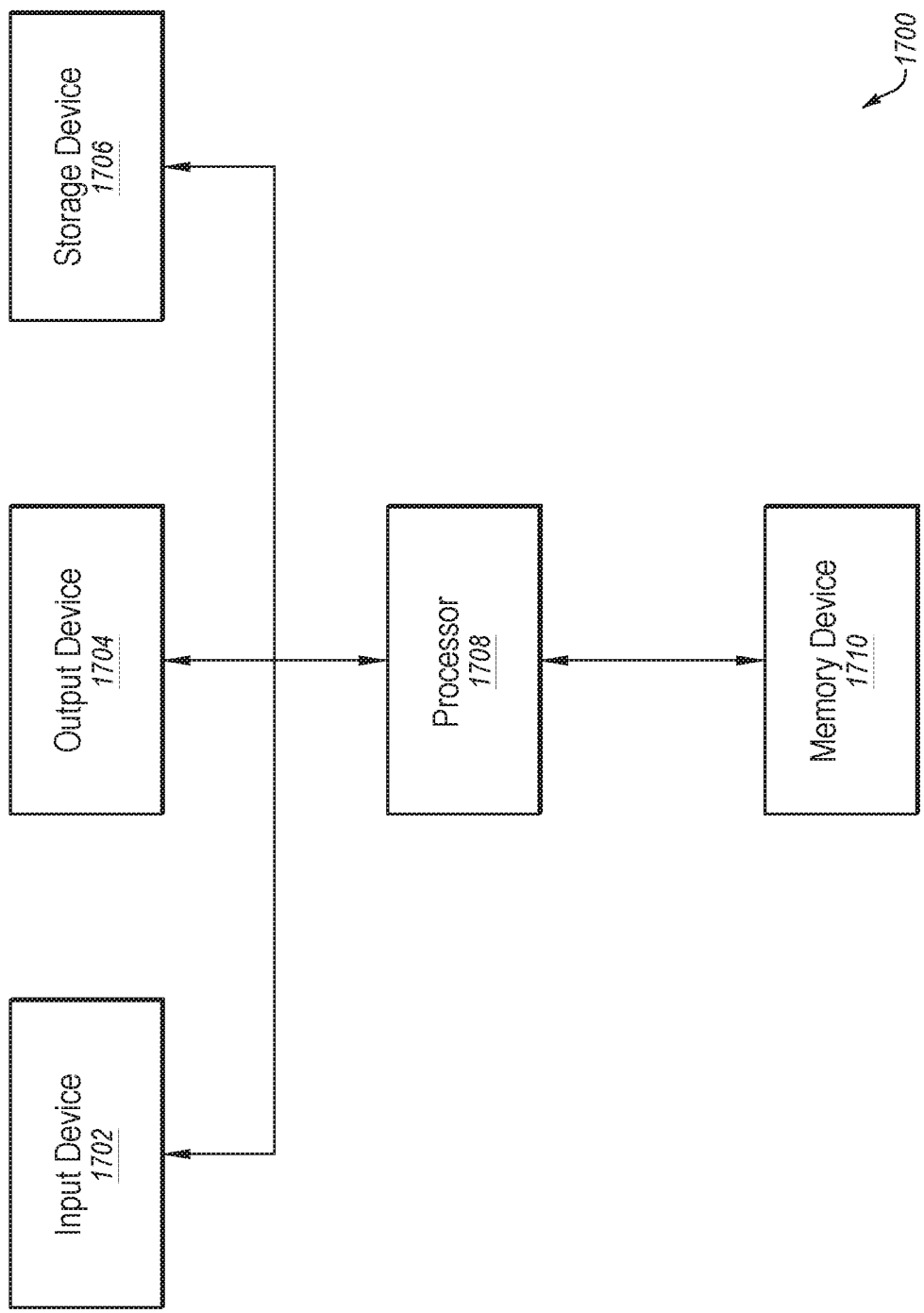
FIG. 17 is a simplified block diagram of an example electronic system implemented according to one or more embodiments described herein.

FIG. 17 is a simplified block diagram of an electronic system 1700 implemented according to one or more embodiments described herein. Electronic system 1700 includes at least one input device 1702, which may include, for example, a keyboard, a mouse, or a touch screen. Electronic system 1700 further includes at least one output device 1704, such as a monitor, a touch screen, or a speaker. Input device 1702 and output device 1704 are not necessarily separable from one another. Electronic system 1700 further includes a storage device 1706. Input device 1702, output device 1704, and storage device 1706 may be coupled to a processor 1708. Electronic system 1700 further includes a memory device 1710 coupled to processor 1708. Memory device 1710, which may include memory device 1600 of FIG. 16, may include an array of memory cells. Electronic system 1700 may include, for example, a computing, processing, industrial, or consumer product. For example, without limitation, electronic system 1700 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

In contrast to some conventional devices, systems, and methods, various embodiments of the present disclosure may be related to dynamically adjusting one or more rates (e.g., auto refresh rates, auto refresh skip rates, and/or row hammer refresh steal rates) of a memory device based one more operational parameters, such as other refresh rates, operating temperatures, and/or an amount of memory device activity. Various embodiments disclosed herein may reduce power consumption and processing overhead of a memory device without substantially decreasing performance and/or reliability of the memory device.

One or more embodiments of the present disclosure include a method of operating a memory device. The method may include determining an operating temperature of a memory bank of a memory device. The method may also include adjusting at least one refresh rate for the memory bank based on the operating temperature of the memory bank. Further, the method may include skipping at least one internal auto refresh of the memory bank in response to the operating temperature being less than or equal to a first threshold temperature.

Some embodiments of the present disclosure include a memory device. The memory device may include a memory array including at least one memory bank. The memory device may also include at least one controller coupled to the memory array. The at least one controller may be configured to set an auto refresh rate for the memory bank based on an operating temperature of the memory bank. The at least one controller may also be configured to set an auto refresh skip rate for the memory bank based on the operating temperature of the memory bank.

Additional embodiments of the present disclosure include an electronic system. The electronic system may include at least one input device, at least one output device, and at least one processor device operably coupled to the input device and the output device. The electronic system may also include at least one memory device operably coupled to the at least one processor device and comprising a memory array and a controller coupled to the memory array. The controller may be configured to control an auto refresh rate for the memory bank based on an operating temperature of the memory bank. The controller may also be configured to control an auto refresh skip rate for the memory bank based on at least one of the auto refresh rate and the operating temperature of the memory bank.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc.," or "one or more of A, B, and C, etc.," is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A method of operating a memory device, comprising:
   determining an operating temperature of a memory bank of a memory device;
   adjusting at least one refresh interval for the memory bank based on the operating temperature of the memory bank; and
   skipping at least one refresh of the memory bank based on at least one of the operating temperature of the memory bank and a number of active signals received at the memory bank, wherein skipping the at least one refresh comprises skipping the at least one refresh such that one of: one refresh command out of three refresh commands are skipped; one refresh command out of two refresh commands are skipped; two refresh commands out of three refresh commands are skipped; and three refresh commands out of four refresh commands are skipped.

2. The method of claim 1, further comprising setting a skip rate for refreshes for the memory bank.

3. The method of claim 2, wherein setting a skip rate comprises setting the skip rate such that for every twelve refresh commands one of: four refresh commands are skipped; six refresh commands are skipped; eight refresh commands are skipped; and nine refresh commands are skipped.

4. The method of claim 1, wherein determining the operating temperature of the memory bank comprises determining the operating temperature via at least one of a temperature sensor of the memory device and a mode register of the memory device.

5. The method of claim 4, wherein adjusting the at least one refresh interval for the memory bank comprises adjusting at least one of an auto refresh interval and a row hammer refresh steal rate for the memory bank.

6. The method of claim 1, wherein skipping at least one refresh comprises:
skipping a first number of refreshes during a refresh interval in response to the operating temperature being less than or equal to a first threshold temperature;
skipping a second number of refreshes in response to the operating temperature being less than or equal to a second threshold temperature, the second threshold temperature less than the first threshold temperature; and
skipping a third number of refreshes in response to the operating temperature being less than or equal to a third threshold temperature, the third threshold temperature less than the second threshold temperature.

7. The method of claim 1, wherein adjusting at least one refresh interval for the memory bank comprise adjusting a refresh rate for the memory bank, and skipping at least one refresh comprises selecting a skip rate based at least partially on the refresh rate for the memory bank.

8. The method of claim 1, wherein adjusting the at least one refresh interval for the memory bank comprises adjusting a row hammer refresh steal rate for the memory bank based the operating temperature of the memory bank and the number of active signals received at the memory bank.

9. A memory device, comprising:
a memory array including at least one memory bank; and
at least one controller coupled to the memory array and configured to:
set a refresh interval for the memory bank based on an operating temperature of the memory bank;
set a row hammer refresh steal rate for the memory bank based on the operating temperature of the memory bank; and
set a refresh skip rate for the memory bank based the operating temperature of the memory bank.

10. The memory device of claim 9, wherein the at least one controller is configured to:
set the refresh skip rate to a first value in response to the operating temperature being less than or equal to a first threshold temperature;
set the refresh skip rate to a second value in response to the operating temperature being less than or equal to a second threshold temperature, the second threshold temperature less than the first threshold temperature; and
set the refresh skip rate to a third value in response to the operating temperature being less than or equal to a third threshold temperature, the third threshold temperature less than the second threshold temperature.

11. The memory device of claim 10, wherein the first threshold temperature is approximately 85° Celsius (C), the second threshold temperature is approximately 60° C., and the third threshold temperature is approximately 45° C.

12. The memory device of claim 9, wherein the at least one controller includes:
a counter configured to generate a count indicative of a number of refresh commands received from an external device at the memory bank;
a first decoder and multiplexer unit coupled to an output of the counter and configured to:
store a first value based on a selected mode of operation; and
generate a first pulse signal in response to the count being equal to the first value;
a flip-flop coupled to an output of the first decoder and multiplexer unit and configured to generate an asserted enable signal in response to the first pulse signal; and
a second decoder and multiplexer unit coupled to the output of the counter configured to:
store a second value based on a number of desired cycles in a refresh interval; and
generate a second pulse signal in response to the count being equal to the second value, the second pulse configured to reset the flip-flop and the counter.

13. The memory device of claim 9, wherein the at least one controller is further configured to set the row hammer refresh steal rate for the memory bank based an amount of activity associated with the memory bank.

14. The memory device of claim 13, wherein the at least one controller includes:
a counter configured to generate a count value indicative of asserted active signal commands received at the memory bank; and
at least one circuit configured to set the row hammer refresh steal rate for the memory bank based on the count value.

15. The memory device of claim 14, wherein the at least one controller further includes a counter selector configured to select a subset of bits of the count value based on the operating temperature of the memory bank.

16. An electronic system, comprising:
at least one input device;
at least one output device;
at least one processor device operably coupled to the input device and the output device; and
at least one memory device operably coupled to the at least one processor device and comprising:
a memory array; and
a controller coupled to the memory array and configured to:
control a refresh interval for the memory array based on an operating temperature of the memory array;
control a row hammer refresh steal rate based on the operating temperature of the memory array; and
control a refresh skip rate for the memory array based on at least one of the refresh interval and the operating temperature of the memory array.

17. The electronic system of claim 16, wherein the controller is further configured to adjust the refresh interval in response to the operating temperature being less than a threshold temperature.

18. The electronic system of claim 16, wherein the controller is further configured to adjust the refresh skip rate in response to the operating temperature being less than a threshold temperature.

* * * * *